(12) United States Patent
Mikhalev et al.

(10) Patent No.: US 8,274,081 B2
(45) Date of Patent: Sep. 25, 2012

(54) SEMICONDUCTOR CONSTRUCTIONS

(75) Inventors: Vladimir Mikhalev, Boise, ID (US);
Jim Fulford, Meridian, ID (US);
Yongjun Jeff Hu, Boise, ID (US);
Gordon A. Haller, Boise, ID (US);
Lequn Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 187 days.

(21) Appl. No.: 12/728,942

(22) Filed: Mar. 22, 2010

(65) Prior Publication Data
US 2011/0227071 A1 Sep. 22, 2011

(51) Int. Cl.
*H01L 29/04* (2006.01)
*H01L 33/16* (2010.01)

(52) U.S. Cl. ........... 257/57; 257/E21.135; 257/E21.615; 438/424; 438/482; 438/365; 438/766

(58) Field of Classification Search .................. None
See application file for complete search history.

(56) References Cited

U.S. PATENT DOCUMENTS

| | | | |
|---|---|---|---|
| 5,652,454 A * | 7/1997 | Iwamatsu et al. | 257/350 |
| 6,395,587 B1 * | 5/2002 | Crowder et al. | 438/149 |
| 6,897,118 B1 * | 5/2005 | Poon et al. | 438/303 |
| 2001/0006853 A1 * | 7/2001 | Tanabe et al. | 438/773 |
| 2008/0268585 A1 * | 10/2008 | Gehring et al. | 438/152 |
| 2009/0035917 A1 | 2/2009 | Ahn et al. | |

* cited by examiner

*Primary Examiner* — Fei Fei Yeung Lopez
(74) *Attorney, Agent, or Firm* — Wells St. John P.S.

(57) ABSTRACT

Some embodiments include methods of forming isolation structures. A semiconductor base may be provided to have a crystalline semiconductor material projection between a pair of openings. SOD material (such as, for example, polysilazane) may be flowed within said openings to fill the openings. After the openings are filled with the SOD material, one or more dopant species may be implanted into the projection to amorphize the crystalline semiconductor material within an upper portion of said projection. The SOD material may then be annealed at a temperature of at least about 400° C. to form isolation structures. Some embodiments include semiconductor constructions that include a semiconductor material base having a projection between a pair of openings. The projection may have an upper region over a lower region, with the upper region being at least 75% amorphous, and with the lower region being entirely crystalline.

6 Claims, 20 Drawing Sheets

SEMICONDUCTOR CONSTRUCTIONS

TECHNICAL FIELD

Semiconductor constructions, semiconductor processing methods, and methods of forming isolation structures.

BACKGROUND

The fabrication of semiconductor-based circuitry comprises formation of highly integrated electrical components (with example electrical components being transistors, resistors and capacitors), and thus comprises forming electrical components in close proximity to each other. Electrically insulative materials (which may also be referred to herein as dielectric materials) may be used to create isolation structures that are utilized to electrically isolate various electrical components from one another.

One method of electrically isolating adjacent electrical components from one another is to use trench isolation. Trench isolation may be formed by creating trenches in a semiconductor material, and then filling the trenches with insulative material.

One type of insulative material that may be used to fill the trenches is silicon oxide formed from spin-on dielectric (SOD) material. Example SOD materials are polysilazanes. When polysilazanes are utilized as SOD materials, the formation of silicon oxide may comprise multiple steps. Initially, spin-on methodology may be used to fill trenches with polysilazane. Subsequently, the polysilazane within the trenches may be converted to silicon oxide by exposing the polysilazane to oxidant and appropriate thermal conditions.

A problem that may occur during utilization of SOD materials is that the SOD materials may create stresses within the adjacent semiconductor material, and such stresses may propagate into dislocations or other defects in the semiconductor material during the subsequent thermal treatments. Accordingly, it is desired to develop new methods for utilizing SOD materials to form isolation structures.

DETAILED DESCRIPTION OF THE ILLUSTRATED EMBODIMENTS

Some embodiments include methods for utilizing SOD material (for instance, polysilazane) to form isolation structures associated with a semiconductor substrate. The methods may include utilization of an amorphizing implant to reduce crystallinity within some regions of the substrate and thereby avoid the prior art problems of defect propagation within the substrate. In an example embodiment, trenches are formed into a monocrystalline semiconductor substrate to define an active region of the substrate as a projection of monocrystalline material remaining between the trenches. SOD material is then formed within the trenches and across the active region. The SOD material may create stresses within the monocrystalline material of the active region. However, such stresses are alleviated by amorphizing at least some of the monocrystalline material within the active region. Subsequently, the SOD material is subjected to appropriate thermal processing to convert such material into a desired dielectric material within the trenches and thereby form isolation structures from the SOD material. Since stresses within the monocrystalline material are alleviated prior to the thermal processing of the SOD material, the prior art problem of defect propagation occurring throughout the monocrystalline material during thermal processing of the SOD material may be diminished, or even prevented.

Example processing is described with reference to FIGS. 1-20.

Figure 1:
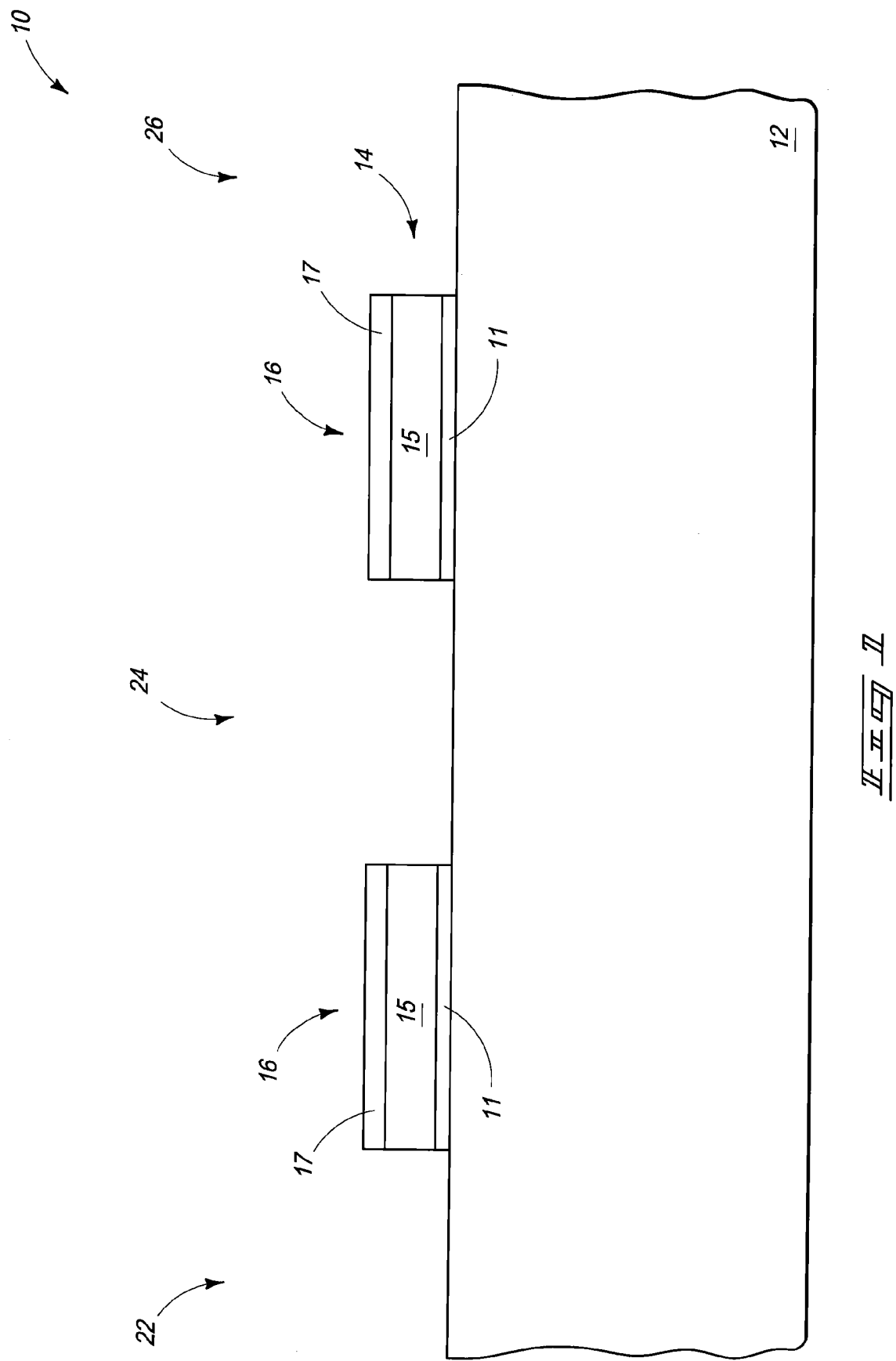
FIGS. 1-6 are diagrammatic cross-sectional views of a portion of a semiconductor construction at various process stages of an example embodiment method.

Referring to FIG. 1, a construction 10 is shown to comprise a semiconductor material 12 having a patterned mask 14 thereover.

Semiconductor material 12 may, for example, comprise, consist essentially of, or consist of monocrystalline silicon lightly background-doped with appropriate p-type dopant. In some embodiments, the material 12 may be semiconductor material that is lightly background doped with appropriate n-type dopant. In some embodiments the semiconductor material 12 may be referred to as a base, and in some embodiments the material 12 may be referred to as a semiconductor substrate. The terms "semiconductor construction" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above. In some embodiments semiconductor material 12 may be considered to correspond to a semiconductor substrate ultimately utilized to support integrated circuitry.

The patterned mask 14 comprises a plurality of spaced apart features 16, with each of the features having stacked materials 11, 15 and 17. In some embodiments, material 11 may be gate dielectric (for instance, silicon dioxide), material 15 may be polycrystalline silicon (which may or may not be conductively-doped at the processing stage of FIG. 1), and material 17 may be an electrically insulative cap (and may, for example, comprise silicon nitride). Materials 11, 15 and 17 may be referred to as a gate stack.

Materials 11, 15 and 17 may be formed into the shown pattern of mask 14 by initially forming materials 11, 15 and 17 entirely across an upper surface of semiconductor material 12; utilizing a photolithographically-patterned photoresist mask (not shown) to define the pattern that is to be formed into materials 11, 15 and 17; utilizing etching to transfer the pattern from the photoresist mask into materials 11, 15 and 17; and then removing the photoresist mask to leave the construction of FIG. 1.

The patterned mask 14 has a plurality of openings 22, 24 and 26 passing therethrough. The features 16 may be lines extending in and out of the page relative to the shown cross-sectional view; and accordingly the openings 22, 24 and 26 may also be linear features extending in and out of the page relative to the shown cross-sectional view. In some embodiments, the features 16 may be considered to be extending segments between the openings 22, 24 and 26 in the shown cross-section of FIG. 1.

Figure 2:
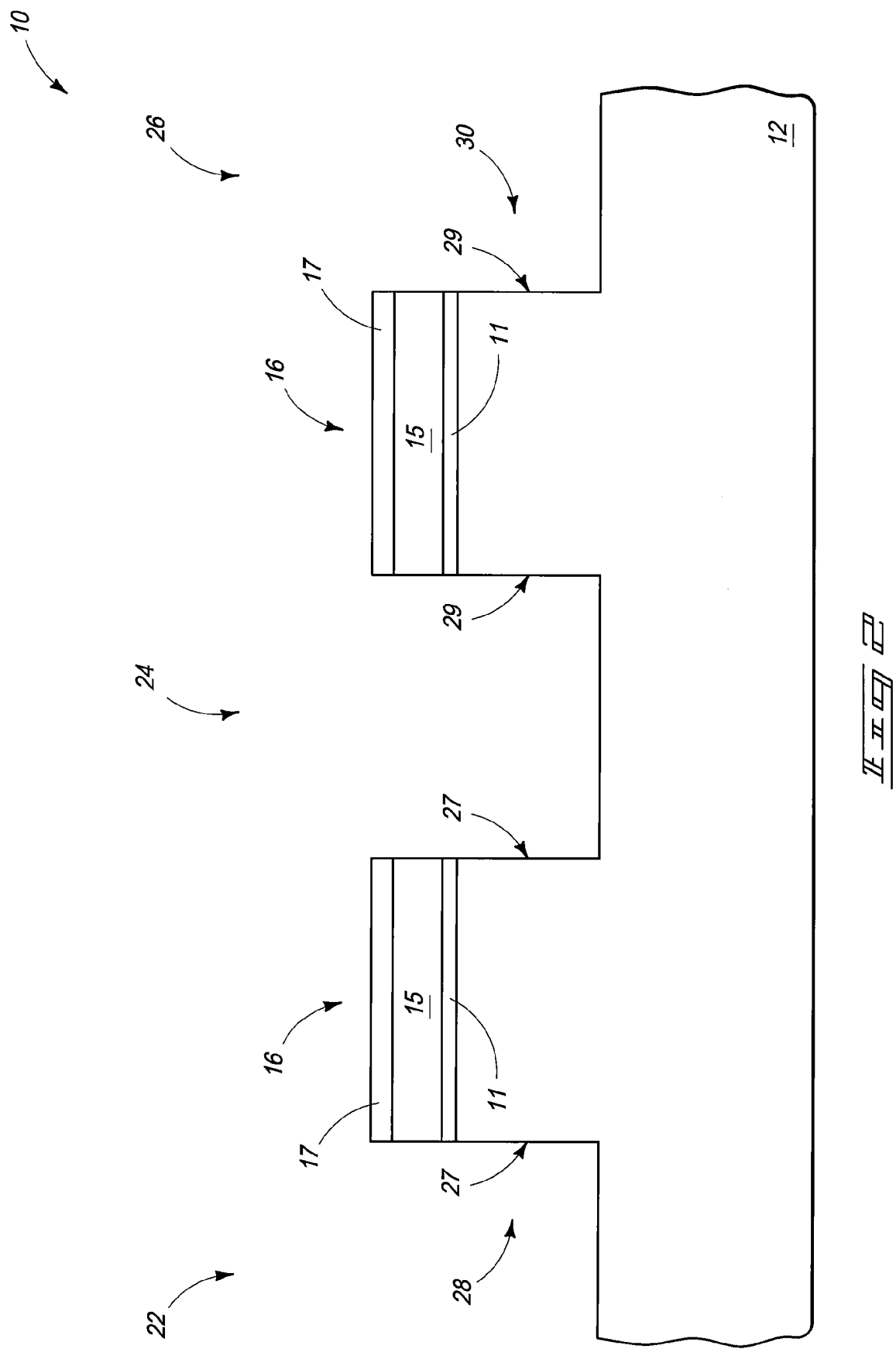

Referring to FIG. 2, openings 22, 24 and 26 are extended into monocrystalline semiconductor material 12 with one or more appropriate etches. In some embodiments, the openings 22, 24 and 26 within material 12 may correspond to trenches that extend in and out of the page relative to the cross-section of FIG. 2.

After openings 22, 24 and 26 are formed within material 12, the regions of crystalline semiconductor material 12 protected by masking features 16 become projections (which may also be referred to herein as pedestals) 28 and 30 extending upwardly between openings 22, 24 and 26. Such projections may ultimately be utilized as active areas of semiconductor devices, and accordingly may be referred to as active area projections in some embodiments. Each of the projections 28 and 30 has a pair of opposing sidewalls on opposing sides of it; with the opposing sidewalls of projection 28 being labeled 27 in FIG. 2, and with the opposing sidewalls of projection 30 being labeled 29 in FIG. 2. Also, each of the projections is between a pair of openings; with projection 28 being between openings 22 and 24, and with projection 30 being between openings 24 and 26.

In some embodiments, openings 22, 24 and 26 may correspond to trenches that extend in and out of the page relative to the cross-section of FIG. 2. In such embodiments, projections 28 and 30 may correspond to linear structures that extend in and out of the page relative to the cross-section of FIG. 2.

The processing of FIGS. 1 and 2 is one method for forming the base 12 into a configuration comprising projections 28 and 30 between the openings 22, 24 and 26. Other methods may be used in other embodiments. For instance, the projections may be epitaxially grown from a surface of a semiconductor material.

Figure 3:
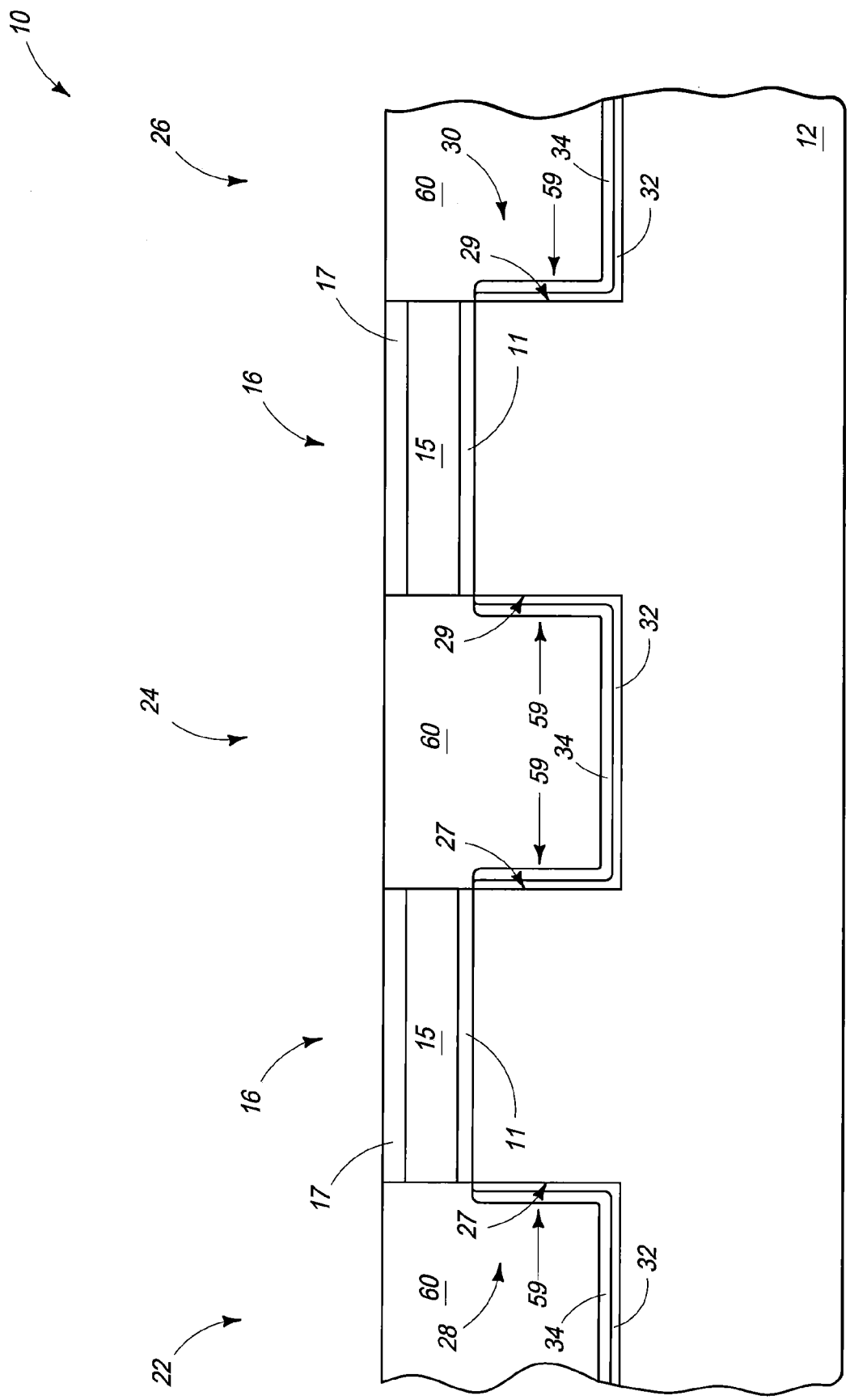

Referring to FIG. 3, liners 32 and 34 are formed within openings 22, 24 and 26, and along the sidewall peripheries 27 and 29 of projections 28 and 30; and then SOD material 60 is formed within the lined openings. The liners 32 and 34 may comprise silicon dioxide and silicon nitride, respectively, and may be formed by any suitable processing. In some embodiments, the liners 32 and 34 may also cover the stacked materials 11, 15 and 17. In some embodiments, one or both of the liners 32 and 34 may be omitted. In some embodiments additional liners may be used besides one or both of the shown liners 32 and 34.

The SOD material 60 may comprise polysilazane. Polysilazanes contain Si, N and H. Example polysilazanes that can be used are hexamethyldisilazane, tetramethyldisilazane, octamethylcyclotetrasilazine, hexamethylcyclotrisilazine, diethylaminotrimethylsilane, dimethylaminotrimethylsilane and perhydro-polysilazane. SOD material is one example of preliminary material that may be formed within openings 22, 24 and 26; with the term "preliminary material" referring to material that may ultimately be treated to form a dielectric material utilized in isolation structures.

Once material 60 is formed over construction 10, the material 60 may extend, or contract, or in other ways create stresses on the underlying crystalline semiconductor material 12. Example stresses are diagrammatically represented in FIG. 3 with arrows 59. The stresses may lead to defects in the crystalline material 12, and a prior art problem (as discussed above in the "Background" section) is that such defects may propagate throughout material 12 during subsequent thermal processing. In some embodiments the material 60 may be subjected to a preliminary thermal treatment at about 500° C. to densify the material 60, which can cause, or enhance, stresses on the adjacent semiconductor material 12.

An aspect of some embodiments is that crystalline semiconductor material within projections 28 and 30 is amorphized to preclude, or at least reduce, the propagation of defects through at least some of the semiconductor material of the projections. (Such amorphization is discussed with reference to FIG. 5.)

Figure 4:
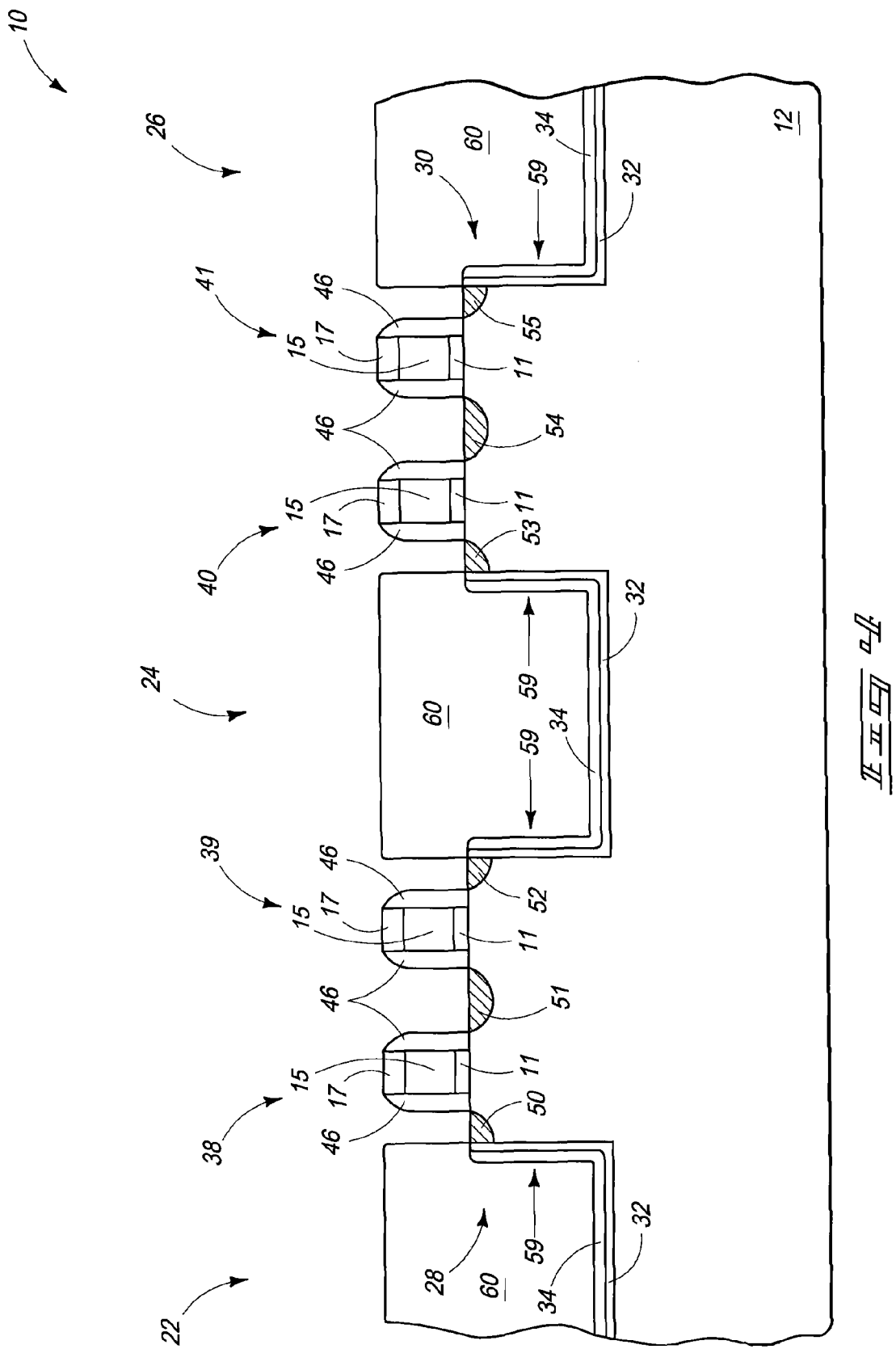

Referring to FIG. 4, the materials 11, 15 and 17 of masking features (or segments) 16 (shown in FIG. 3) are patterned into transistor gates 38-41. In the shown embodiment, pairs of transistor gates are formed over each of the projections; with gates 38 and 39 being over projection 28, and gates 40 and 41 being over projection 30. Sidewall spacers 46 are formed along the sidewalls of the transistor gates. The spacers 46 may comprise any suitable composition or combination of compositions, and may, for example, comprise, consist essentially of, or consist of one or more of silicon dioxide, silicon nitride and silicon oxynitride.

The polycrystalline silicon 15 may be conductively doped by the processing stage of FIG. 4, or may be doped at a subsequent processing stage.

The transistor gates 38-41 may be comprised by wordlines that extend in and out of the page relative to the cross-section of FIG. 4.

Source/drain regions 50-55 extend into the crystalline semiconductor material 12 along upper surfaces of projections 28 and 30. Individual transistor gates electrically couple pairs of the source/drain regions to one another. For instance, transistor gate 38 electrically couples source/drain regions 50 and 51 to one another, and transistor gate 39 electrically couples source/drain regions 51 and 52 to one another. An individual transistor gate together with the source/drain regions coupled to one another through the gate forms a transistor device. Thus, gate 38 together with source/drain regions 50 and 51 forms a transistor device, and similarly gate 39 together with source/regions 51 and 52 forms another transistor device.

In the shown embodiment, source/drain regions 51 and 54 are shared between a pair of adjacent transistor devices, and source/drain regions 50, 52, 53 and 55 are not shared. In subsequent processing (discussed below with reference to FIG. 6), bit lines may be electrically connected with the shared source/drain regions 51 and 54, and charge-storage devices (for instance capacitors) may be electrically connected with the source/drain regions 50, 52, 53 and 55. The transistors may thus be incorporated into a plurality of dynamic random access memory (DRAM) devices. The transistors of FIG. 4 are example devices that may be formed over projections 28 and 30. In other embodiments, electrical components formed over projections 28 and 30 may or may not include transistors, and may or may not be configured for incorporation in DRAM. For instance, in other embodiments, the components formed over projections 28 and 30 may configured for incorporation into other memory besides DRAM, and/or may be configured for incorporation into logic. In some embodiments, the transistor gates 39 and 41, and the source/drain regions 51 and 54 may be omitted (e.g., in embodiments in which NAND is formed).

The embodiment of FIG. 4 shows SOD material remaining at a height above an uppermost surface of projections 28 and 30. In other embodiments (such as an embodiment shown in FIG. 7) a height of the SOD material may be reduced with an appropriate etch, and/or a chemical-mechanical polishing (CMP) recess or dishing process. At least some of the reduction in the height of the SOD material may be conducted simultaneously with the patterning of transistor gates 38-41 in some embodiments. In some embodiments, the height of the SOD materials may be reduced to below the height of source/drain regions 50-55.

Figure 5:
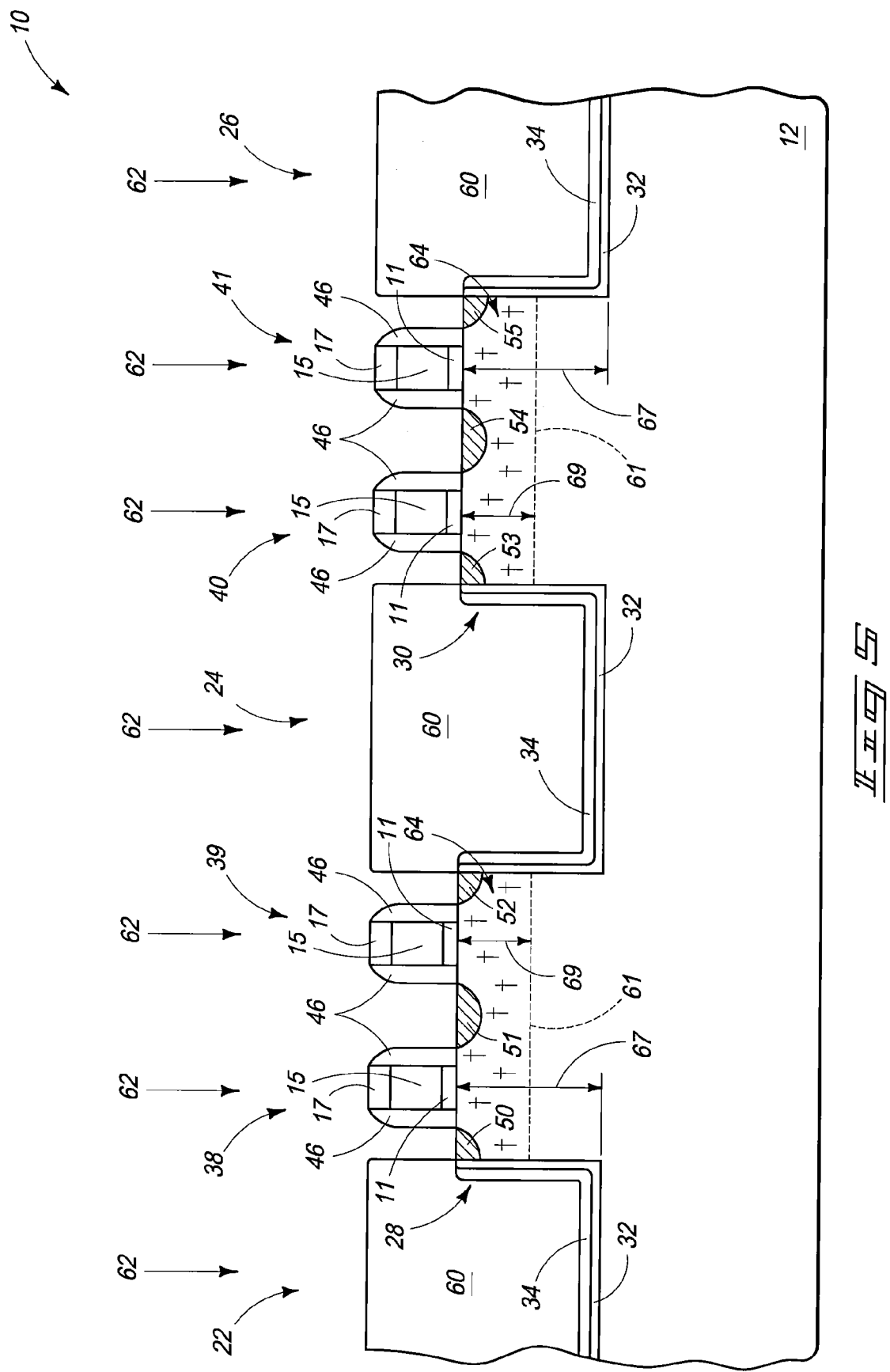

Referring to FIG. 5, an example method for amorphizing semiconductor material within projections 28 and 30 is illustrated. Specifically, dopant (which may also be referred to as one or more species) 62 is implanted into semiconductor material 12 of projections 28 and 30 to amorphize such material. The amorphized regions are illustrated with labels 64, and crosses are shown dispersed within the amorphized regions to diagrammatically illustrate the amorphous phase of the amorphized regions. In the shown embodiment, it is only upper portions of projections 28 and 30 that are amorphized. Dashed lines 61 are utilized to diagrammatically illustrate boundaries between the amorphized regions of the semiconductor material and the non-amorphized regions. In some embodiments, the dashed lines 61 may not be straight lines due to gates 38-41 imparting a shadowing effect during implantation of species 62. The amorphized regions may be just within the source/drain regions in some embodiments, shallower than the source/drain regions in some embodiments, and/or deeper than the source/drain regions in some embodiments. The amorphized regions may be at least 75 percent amorphous (as determined by any suitable analytical methodology), and in some embodiments may be entirely amorphous. In some embodiments, the amorphizing implant of FIG. 5 is conducted simultaneously with the implant used to form the source/drain regions 50-55. Accordingly, the amorphizing implant may be conducted at the processing stage of FIG. 4.

The dopant (or species) 62 implanted into crystalline material 12 to transform the crystalline material into the amorphous regions 64 may comprise any suitable species or combination of species. In some embodiments, the dopant may contain one or more substances having an atomic mass of at least 35 atomic mass units (amu), or even greater than 40 amu. For instance, the dopant may contain one or both of $BF_2$ and arsenic. If a single dopant species having an atomic mass of at least 35 amu is implanted, such dopant species may be implanted to a dose of at least about $1\times10^{15}$ atoms/cm$^3$ (for instance, $BF_2$ may be implanted to a dose of at least about $1\times10^{14}$ atoms/cm$^3$). If multiple dopant species having atomic masses of at least 35 amu are implanted, a total combined dose of all of the species may be at least about $1\times10^{15}$ atoms/cm$^3$. In some embodiments, the dopant 62 may contain one or more species having an atomic mass of less than 40 amu, and such species may be implanted to a total combined dose of at least about $1\times10^{16}$ atoms/cm$^3$ (for instance, B may be implanted to a dose of at least about $3\times10^{16}$ atoms/cm$^3$).

In the shown embodiment it is only an upper portion of projections 28 and 30 that is amorphized. In a specific embodiment, the projections may each have a height 67 of about 3000 angstroms, and the amorphizing may be conducted to form an amorphized region 64 that has a depth 69 of less than or equal to about 700 angstroms (or in other words, less than or equal to about ⅓ of the height of the projections is amorphized in some embodiments). The amorphized region may be sufficiently deep to protect the active area that includes the source/drain regions 50-55, and the regions proximate thereto, from being adversely impacted by defect propagation during subsequent thermal processing of construction 10.

In the shown embodiment the amorphization is conducted after deposition of preliminary material 60. In other embodiments, at least some of the amorphization may be conducted prior to deposition of preliminary material 60. However, it can be advantageous to induce the amorphization after deposition of material 60, in that this enables the amorphization to be conducted after some strain has been created within the semiconductor material 12. This strain may create point defects, which may then be removed by the amorphization. Also, conducting the amorphization after material 60 is deposited reduces a possibility that the amorphous phase induced within region 64 will have time and opportunity to recrystallize prior to subsequent thermal processing. If the amorphous phase were to recrystallize, point defects may reform therein. The re-establishment of the point defects could reduce or eliminate the advantage of the initial amorphization.

Figure 6:
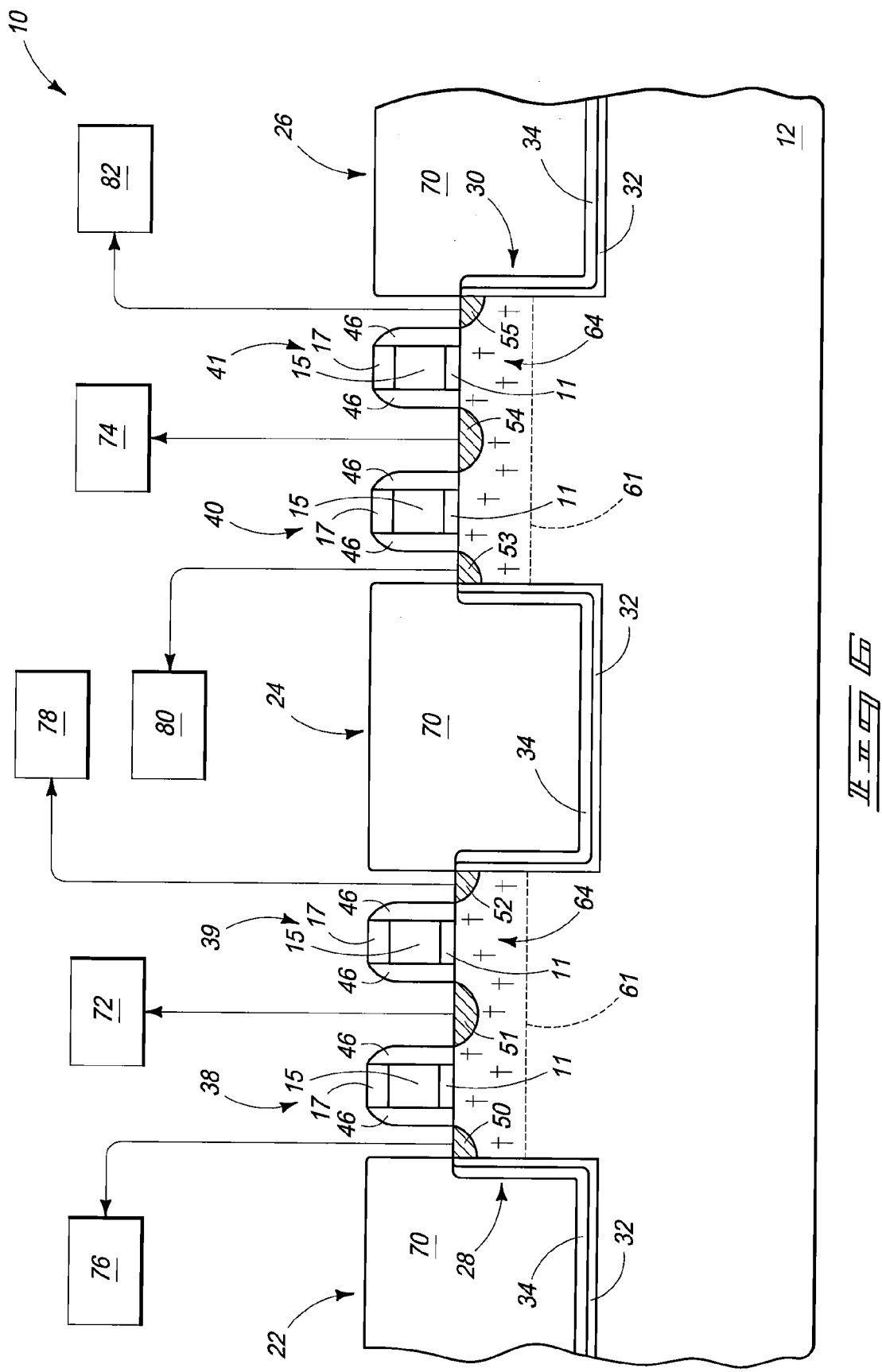

Referring to FIG. 6, SOD material 60 (FIG. 5) is subjected to appropriate thermal processing to convert the SOD material 60 to a dielectric material 70. For example, polysilazane may be exposed to steam and to a temperature of at least about 400° C. (which may be from about 400° C. to about 1100° C. in some embodiments, and which may be a temperature of at least about 1000° C. in some embodiments) to convert the polysilazane to silicon dioxide, and to densify such silicon oxide. The amorphous regions 64 may prevent defects from propagating through active regions at the upper portions of projections 28 and 30, and may thus protect such active regions from being detrimentally affected during the thermal processing.

The dielectric material 70 forms isolation structures within the openings 22, 24 and 26, with such isolation structures electrically isolating the electrical components associated with the top of projection 28 from those associated with the top of projection 30.

Source/drain regions 51 and 54 are electrically connected to bit lines 72 and 74; and source/drain regions 50, 52, 53 and 55 are electrically connected to charge storage devices (for instance, capacitors) 76, 78, 80 and 82. The electrical components associated with the tops of projections 28 and 30 are thus incorporated into a plurality of DRAM unit cells. In other embodiments, the components associated with the tops of projections 28 and 30 may be configured for incorporation into other integrated circuitry besides the shown DRAM unit cells. In some embodiments, transistor gates 39 and 41, and source/drain regions 51 and 54 may be omitted. An example of other circuitry that may be formed with processing analogous to that of FIGS. 1-6 is CMOS.

Figure 7:
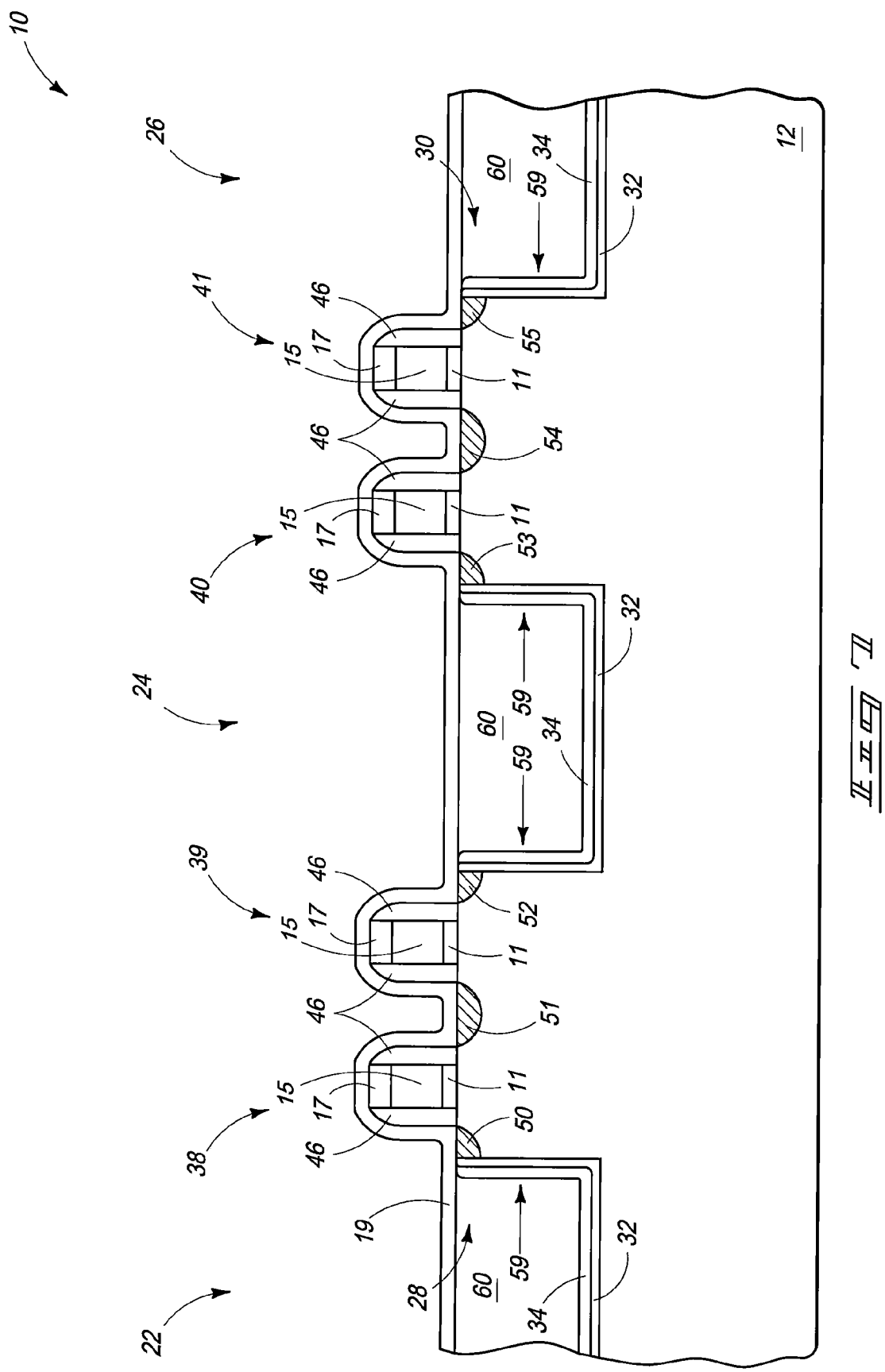
FIGS. 7 and 8 are diagrammatic cross-sectional views of a portion of a semiconductor construction at various process stages of another example embodiment method, with the processing stage of FIG. 7 following that of FIG. 3.
Figure 8:
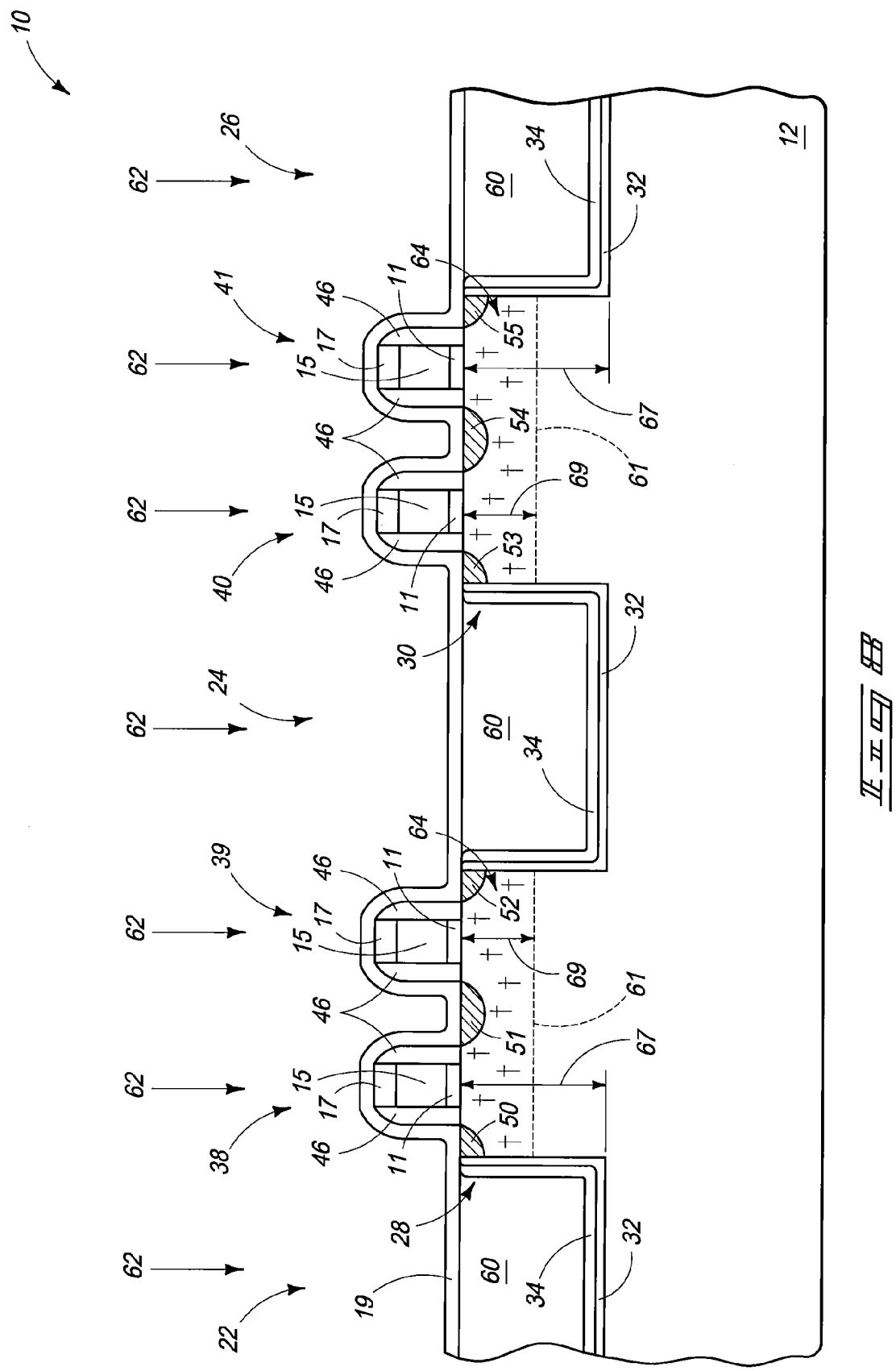

FIGS. 1-6 illustrate an example embodiment in which an amorphizing implant is provided into active regions after formation of transistor gates over the active regions, and while upper surfaces of the monocrystalline material 12 of the active regions is exposed. In other embodiments, the upper surface of the monocrystalline material may be covered by one or more layers. FIGS. 7 and 8 illustrate an example embodiment in which an amorphizing implant is provided into active regions while an upper surface of the monocrystalline material of the active regions is covered by one or more layers.

Referring to FIG. 7, construction 10 is shown at a processing stage subsequent to that of FIG. 3. The construction of FIG. 7 is similar to that of FIG. 4 in that it comprises the transistor gates 38-41 and the source/drain regions 50-55. However, unlike the construction of FIG. 4, the construction of FIG. 7 further comprises a layer (which may also be referred to as a liner) 19 over an upper surface of monocrystalline material 12. The layer 19 extends over and between the transistor gates 30-41, and may be a dielectric material, such as, for example, silicon nitride, silicon dioxide formed from tetraethyl orthosilicate, etc. FIG. 7 also differs from FIG. 4 in that FIG. 7 shows an example embodiment in which the height of material 60 is reduced to at or below a height of the tops of projections 28 and 30. The different height of material 60 in FIG. 7 relative to FIG. 4 is provided to show an alternative embodiment of the processing of material 60. In other embodiments, the processing of FIG. 7 may be conducted while leaving material 60 at a height comparable to that of FIG. 4, or the processing of FIG. 4 may be conducted with material 60 at a height comparable to that of FIG. 7.

Although only the single layer 19 is shown extending over and between the transistor gates, in other embodiments there may be multiple layers present at the processing stage of FIG. 7. In some embodiments, at least some components of the source/drain regions 50-55 may be implanted into material 12 before formation of layer 19; and in some embodiments at least some components of the source/drain regions 50-55 may be implanted into material 12 after formation of layer 19. In some embodiments, the shown layer 19 may be silicon dioxide or silicon nitride; or may be replaced with two layers, which may be silicon dioxide and silicon nitride.

Referring to FIG. 8, the amorphizing implant is conducted after formation of layer 19. Accordingly, the amorphizing implant comprises driving dopant 62 through layer 19 and into the active regions within projections 28 and 30. In the shown embodiment, the amorphizing implant of FIG. 8 occurs sequentially relative to the implant of the dopant of the source/drain regions 50-55. In other embodiments, the amorphizing implant of FIG. 8 may be conducted simultaneously with the implant of at least some of the dopant of source/drain regions 50-55.

The embodiments of FIGS. 1-8 comprise utilization of masking structures 16 (FIG. 1) that contain materials of a gate stack (specifically, the gate dielectric 11, the polycrystalline silicon 15 and the electrically insulative capping material 17). In other embodiments, the masking structures may comprise sacrificial materials, such as, for example, silicon nitride over pad oxide. FIGS. 9-15 illustrate an example embodiment utilizing masking structures that comprise sacrificial materials.

Figure 9:
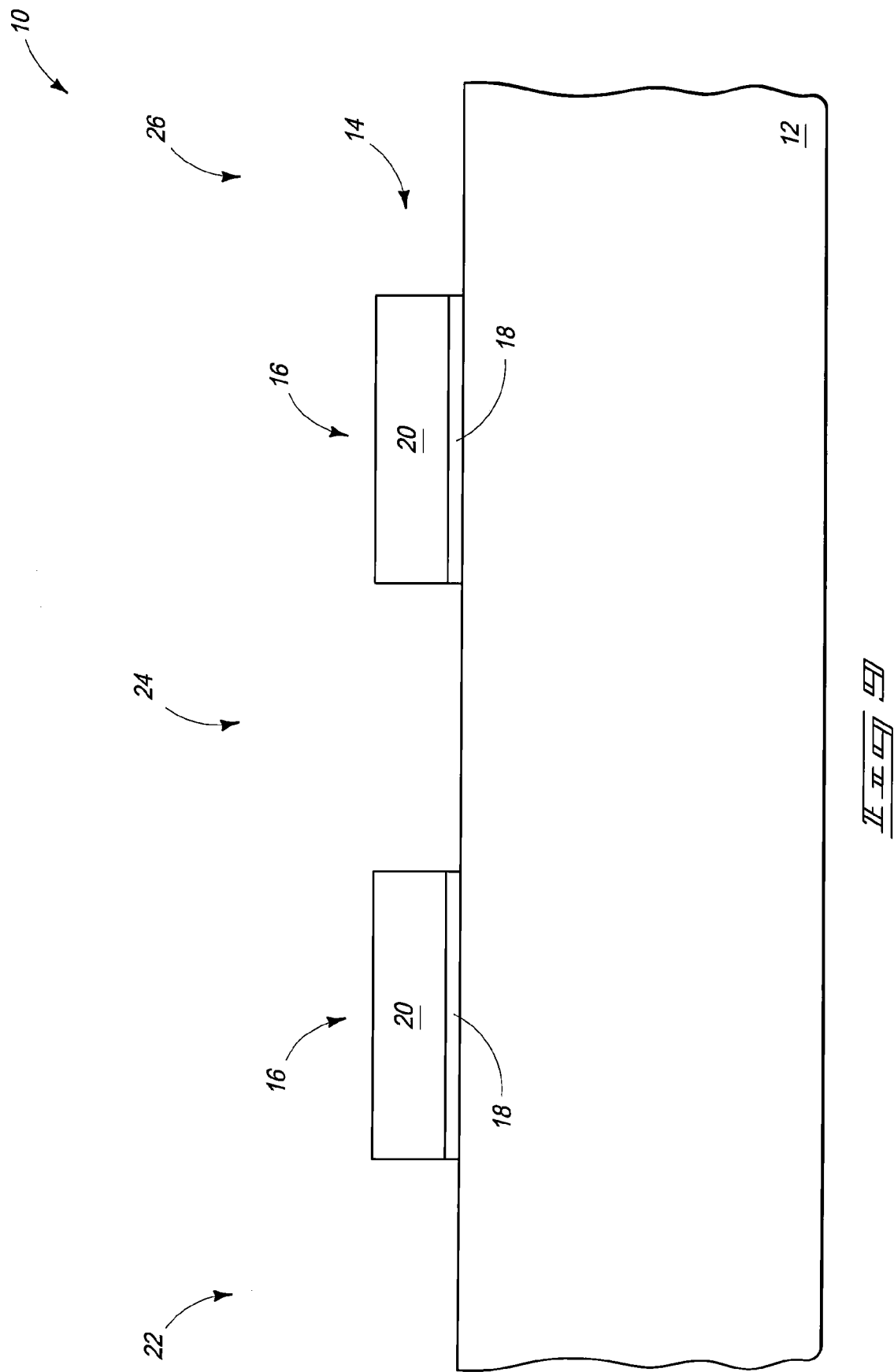
FIGS. 9-15 are diagrammatic cross-sectional views of a portion of a semiconductor construction at various process stages of another example embodiment method.

Referring to FIG. 9, construction 10 is shown at a processing stage similar to that of FIG. 1. The construction includes a patterned mask 14 over semiconductor material 12. Patterned mask 14 of FIG. 9 comprises a plurality of spaced apart features 16, with each of the features having a material 20 supported over a material 18. In some embodiments, materials 20 and 18 may be a hard mask and a pad layer, respectively. In such embodiments, material 20 may comprise, consist essentially of, or consist of silicon nitride; and material 18 may comprise, consist essentially of, or consist of silicon dioxide.

Materials 18 and 20 may be formed into the shown pattern of mask 14 by initially forming materials 18 and 20 entirely across an upper surface of semiconductor material 12; utilizing a photolithographically-patterned photoresist mask (not shown) to define the pattern that is to be formed into materials 18 and 20; utilizing etching to transfer the pattern from the photoresist mask into materials 18 and 20; and then removing the photoresist mask to leave the construction of FIG. 9.

The patterned mask 14 has the plurality of openings 22, 24 and 26 passing therethrough. The features 16 may be lines extending in and out of the page relative to the shown cross-sectional view; and accordingly the openings 22, 24 and 26 may also be linear features extending in and out of the page relative to the shown cross-sectional view.

Figure 10:
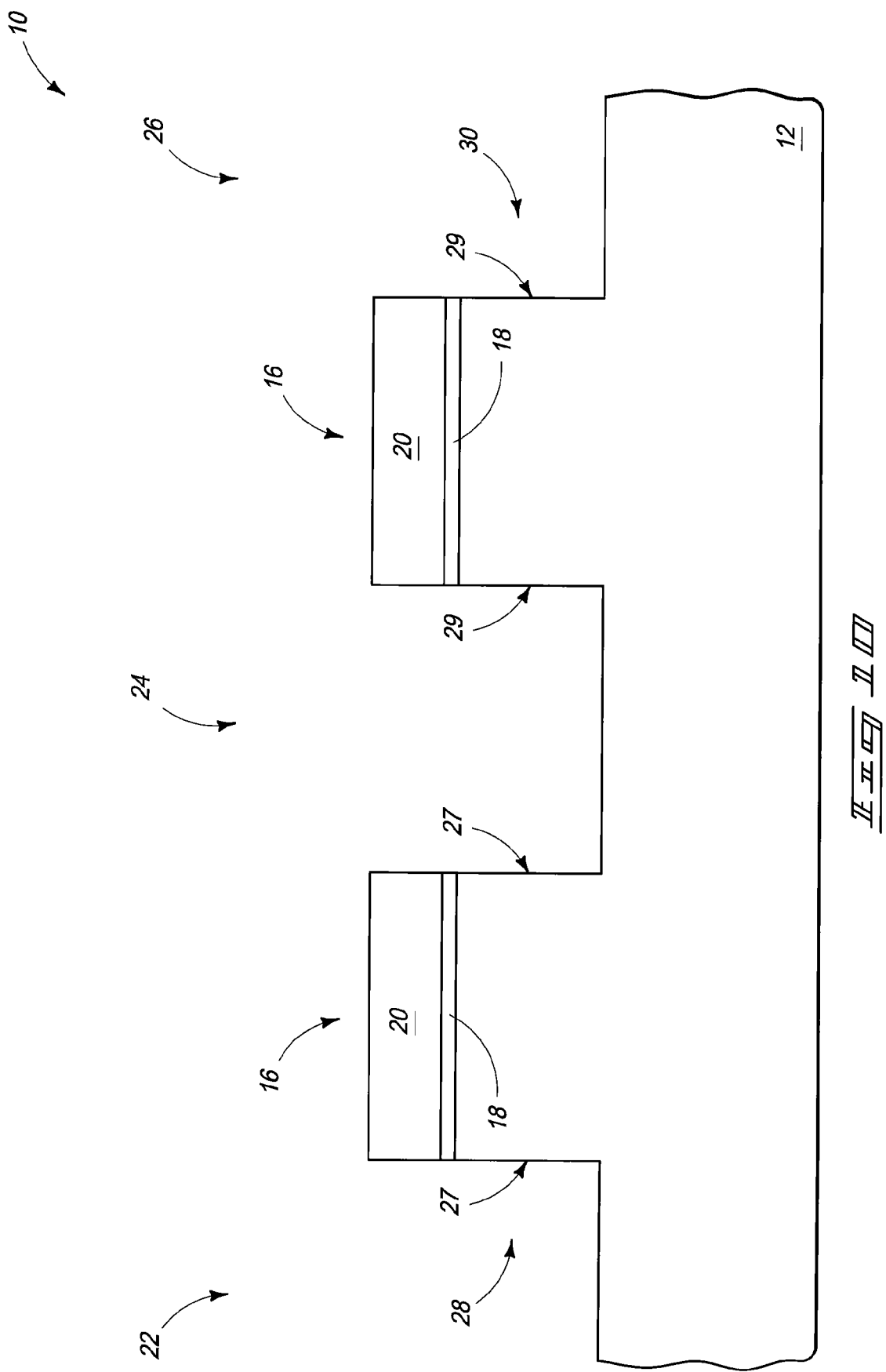

Referring to FIG. 10, openings 22, 24 and 26 are extended into monocrystalline semiconductor material 12 with one or more appropriate etches. In some embodiments, the openings 22, 24 and 26 within material 12 may correspond to trenches that extend in and out of the page relative to the cross-section of FIG. 10.

After openings 22, 24 and 26 are formed, the regions of crystalline semiconductor material 12 protected by masking features 16 become projections 28 and 30 extending upwardly between openings 22, 24 and 26. Projection 28 has the pair of opposing sidewalls 27, and projection 30 has the pair of opposing sidewalls 29. Each of the projections is between a pair of openings; with projection 28 being between openings 22 and 24, and with projection 30 being between openings 24 and 26. Although openings 22, 24 and 26 are separate from one another in the cross-sectional view of FIG. 10, in some embodiments two or more of the openings may connect with one another in a location outside of the view of FIG. 10. For instance, in some embodiments the openings may wrap entirely around lateral peripheries of the shown projections.

The processing of FIGS. 9 and 10 is one method for forming the base 12 into a configuration comprising projections 28 and 30 between the openings 22, 24 and 26. Other methods may be used in other embodiments. For instance, the projections may be epitaxially grown from a surface of a semiconductor material.

Figure 11:
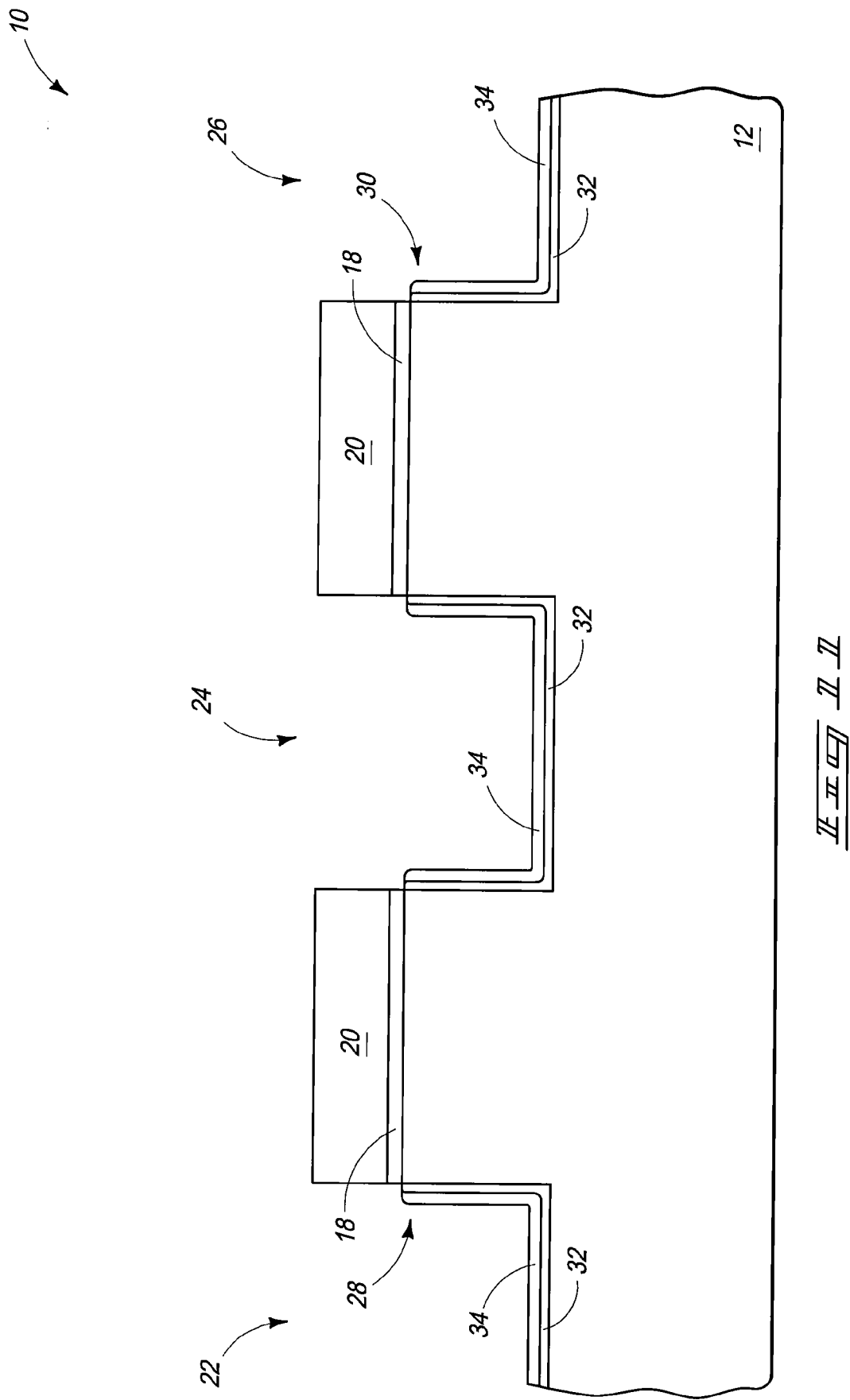

Referring to FIG. 11, the liners 32 and 34 are formed within openings 22, 24 and 26, and along the sidewall peripheries 27 and 29 of projections 28 and 30. In some embodiments, one or both of the liners 32 and 34 may be omitted. In some embodiments, additional liners may be used besides one or both of the shown liners 32 and 34.

Figure 12:
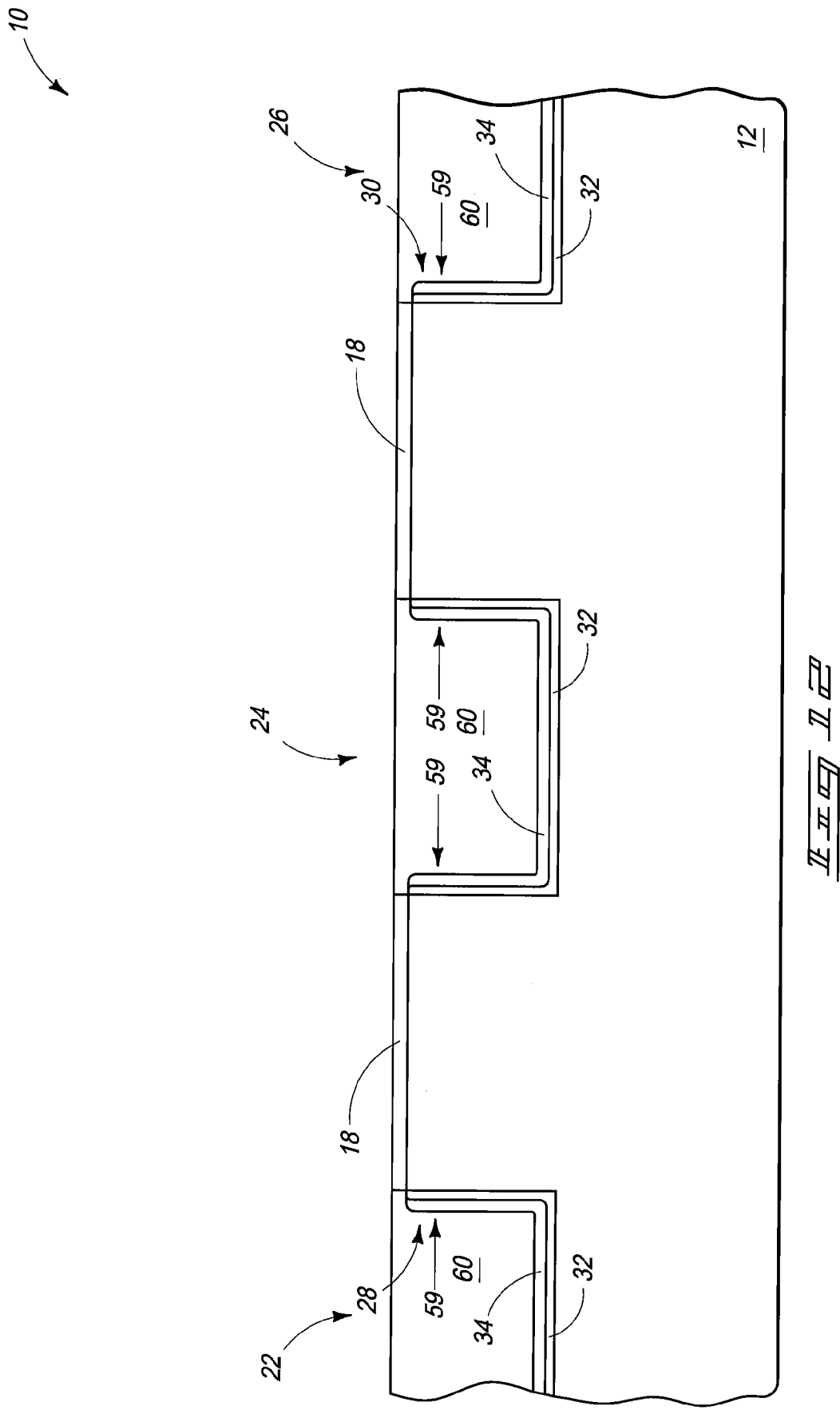

Referring to FIG. 12, SOD material 60 is formed within openings 22, 24 and 26. The processing stage of FIG. 12 has the silicon nitride 20 of masking features 16 (FIG. 11) removed. The material 60 may be formed within the openings before or after the removal of the nitride 20 (FIG. 11) of the masking features 16. For instance, in some embodiments, the material 60 may be formed over the material 20 (FIG. 11) as it is formed within the openings 22, 24 and 26; and then planarization (for instance, CMP) may be conducted to form the construction of FIG. 12.

Once material 60 is provided within the openings 22, 24 and 26, the material 60 may extend, or contract, or in other ways create stresses on adjacent crystalline semiconductor material 12, analogously to the stresses discussed above with reference to FIG. 3. Example stresses are diagrammatically represented in FIG. 12 with arrows 59.

Figure 13:
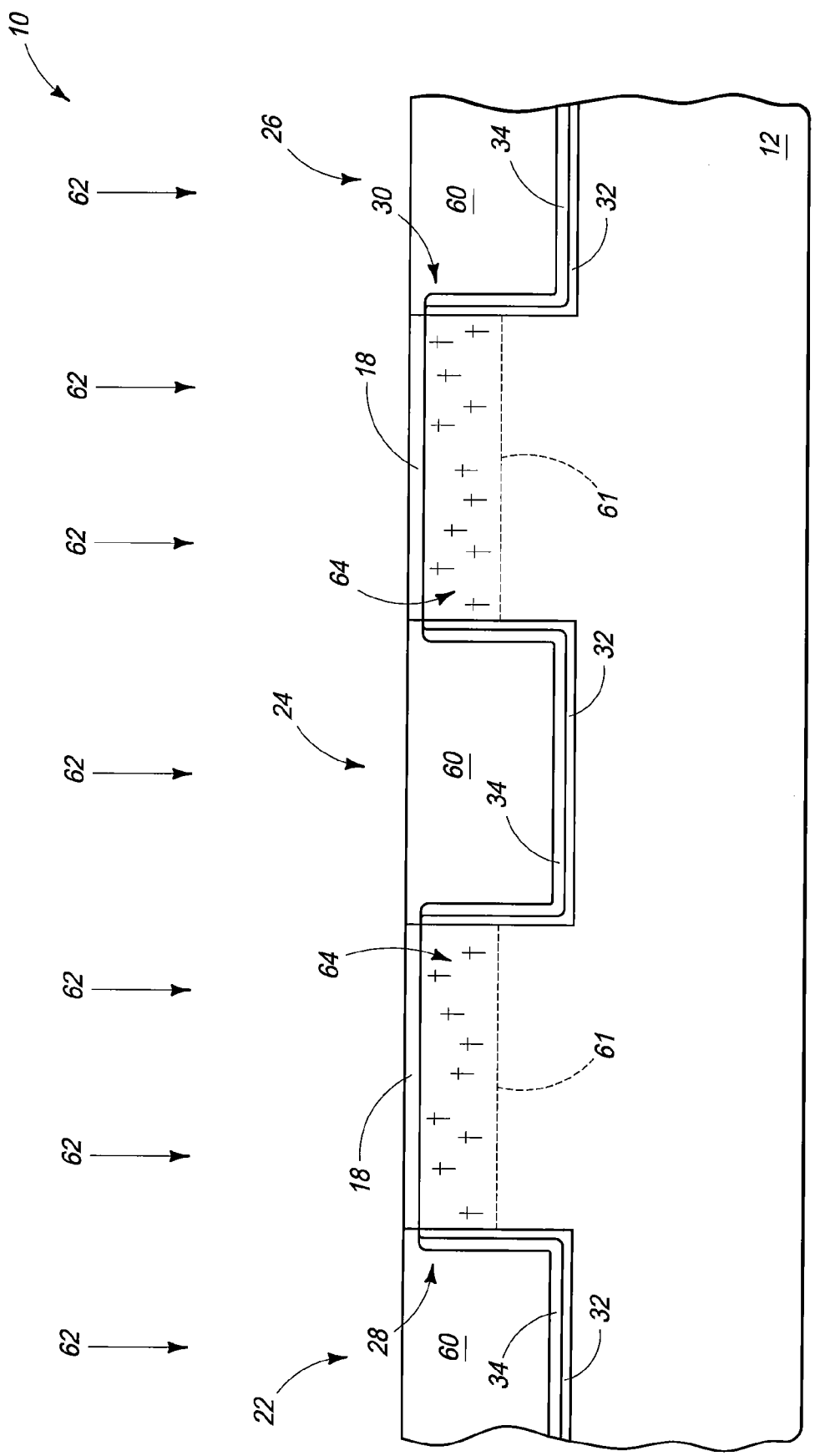

Referring to FIG. 13, dopant 62 is implanted into semiconductor material 12 of projections 28 and 30 to amorphize such material; analogously to the implanting discussed above with reference to FIG. 5. In some embodiments, species 62 is implanted into semiconductor material 12 without the layer 18 being over material 12. The amorphized regions of FIG. 13 are illustrated with labels 64 (like those discussed above with reference to FIG. 5), and crosses are shown dispersed within the amorphized regions to diagrammatically illustrate the amorphous phase of the amorphized regions. In the shown embodiment, it is only upper portions of projections 28 and 30 that are amorphized. Dashed lines 61 are utilized to diagrammatically illustrate boundaries between the amorphized regions of the semiconductor material and the non-amorphized regions. The amorphized regions may be at least 75 percent amorphous (as determined by any suitable analytical methodology), and in some embodiments may be entirely amorphous. The dopant 62 utilized at the processing stage of FIG. 13 may contain any of the dopant species discussed above with reference to FIG. 5.

Figure 14:
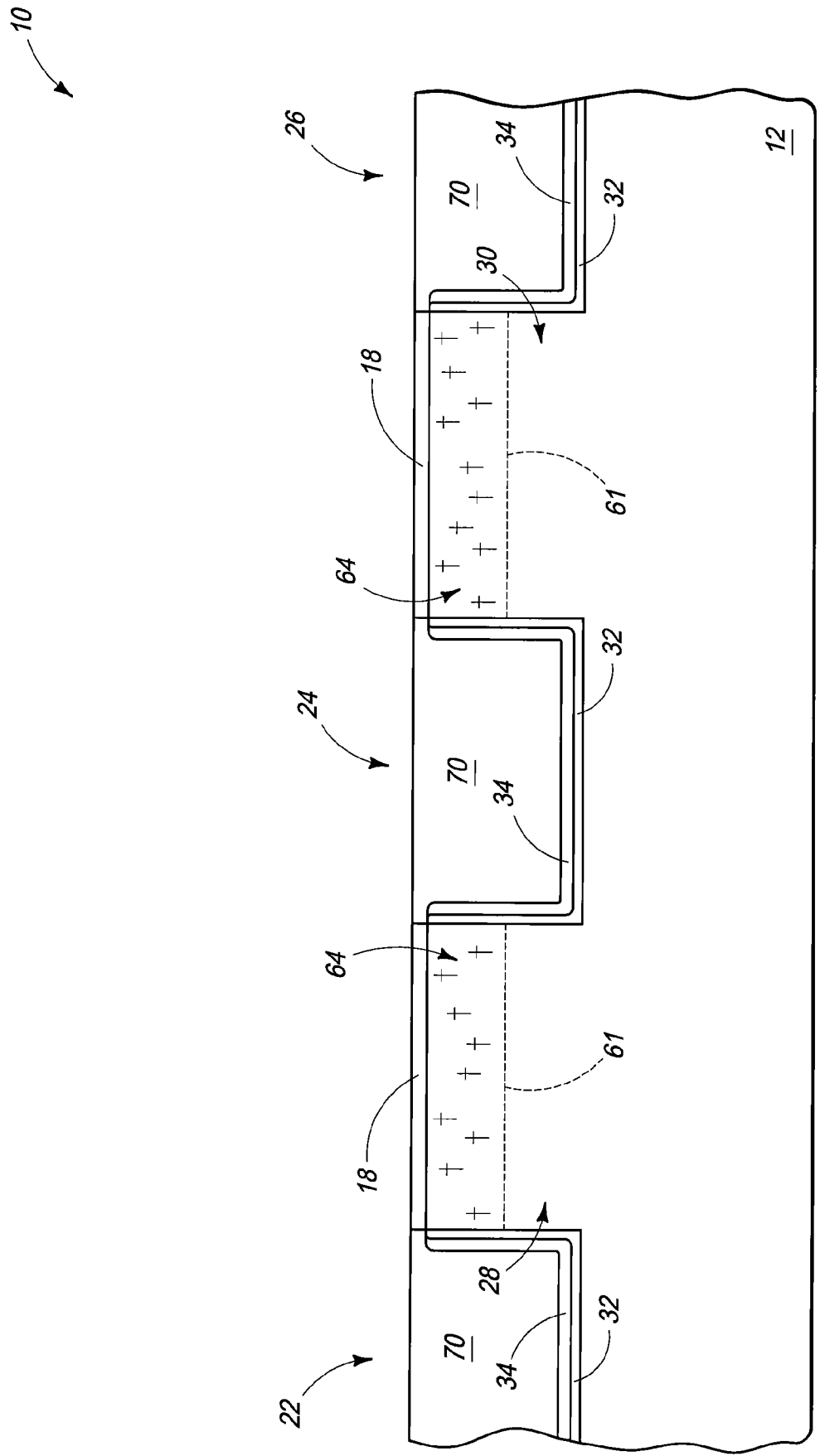

Referring to FIG. 14, SOD material 60 (FIG. 13) is subjected to appropriate thermal processing to convert the SOD material into a dielectric material 70. For example, polysilazane may be exposed to steam and to a temperature of at least about 400° C. (which may be from about 400° C. to about 1100° C. in some embodiments, and which may be a temperature of at least about 1000° C. in some embodiments) to convert the polysilazane to silicon dioxide, and to densify such silicon oxide. The amorphous regions 64 may prevent defects from propagating through active regions at the upper portions of projections 28 and 30, and may thus protect such active regions from being detrimentally affected during the thermal processing. The dielectric material 70 forms isolation structures within the openings 22, 24 and 26. Such isolation structures may be utilized to electrically isolate electrical components associated with the top of projection 28 from those associated with the top of projection 30. Example electrical components are transistor devices, such as those shown in FIG. 15.

Figure 15:
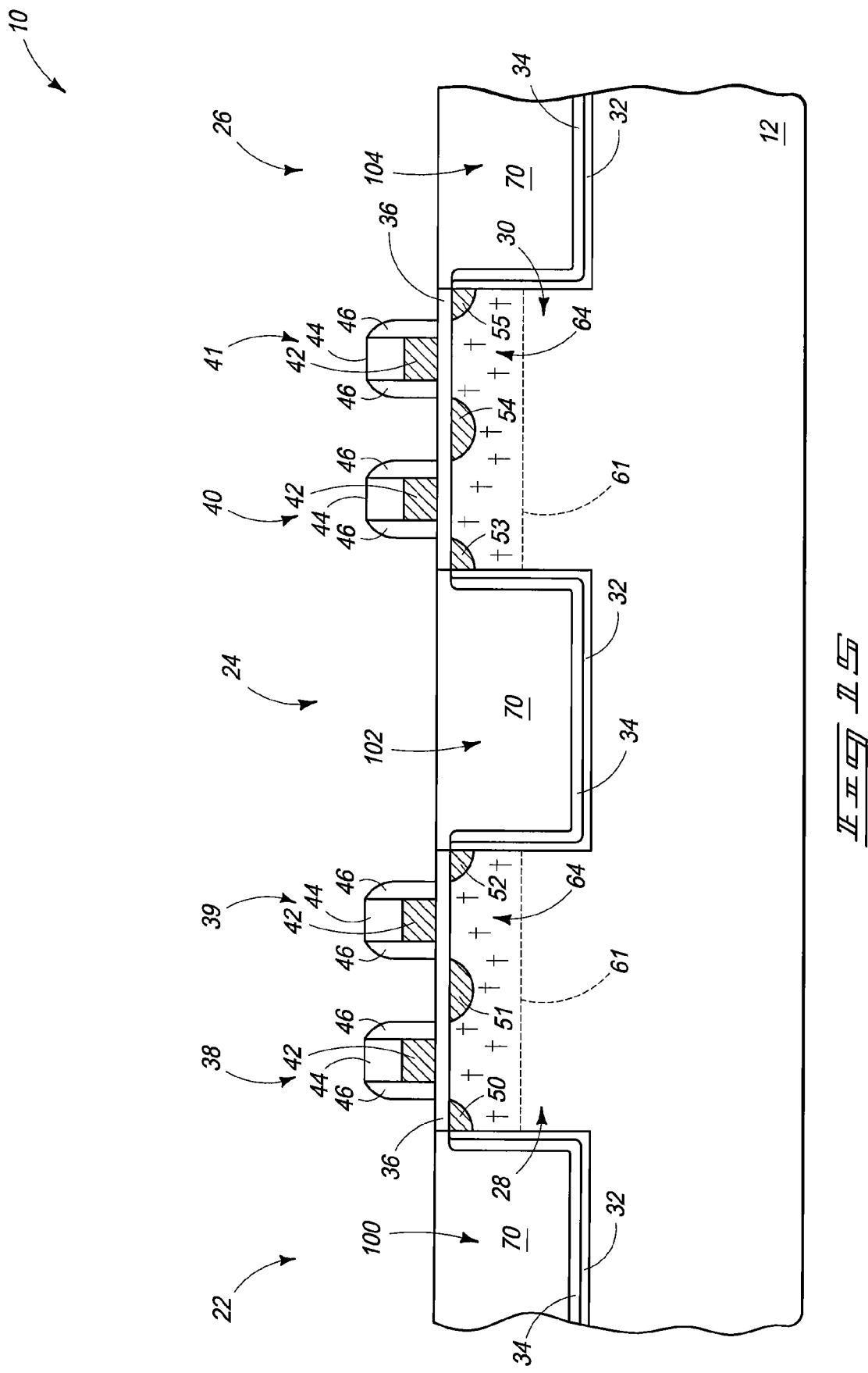

The transistor devices of FIG. 15 are analogous to those discussed above with reference to FIG. 6, and comprise gate dielectric 36 (which replaces the pad oxide 18 [FIG. 14] in the shown embodiment), transistor gates 38-41, and source/drain regions 50-55. In the shown embodiment, each of the individual transistor gates comprises an electrically conductive material 42 directly over the gate dielectric 36, and an electrically insulative material 44 directly over the conductive material 42. The conductive material 42 may comprise any suitable electrically conductive composition or combination of compositions, and may, for example, comprise, consist essentially of, or consist of one or more of various metals, metal-containing compositions, and conductively-doped semiconductor materials. The insulative material 44 may comprise any suitable composition or combination of compositions, and may, for example, comprise, consist essentially of, or consist of one or more of silicon dioxide, silicon nitride and silicon oxynitride.

Sidewall spacers 46 are formed along sidewall surfaces of materials 42 and 44. The spacers 46 may comprise any suitable composition or combination of compositions, and may, for example, comprise, consist essentially of, or consist of one or more of silicon dioxide, silicon nitride and silicon oxynitride.

The transistor gates 38-41 may be comprised by wordlines that extend in and out of the page relative to the cross-section of FIG. 15.

The various source/drain regions may be electrically connected with bit lines and charge-storage devices analogously to the connections discussed above with reference to FIG. 6. In other embodiments, other electrical components may be formed instead of the transistor devices of FIG. 15.

The processing of FIGS. 1-15 illustrates a few examples of the many embodiments that may be utilized for amorphizing monocrystalline semiconductor material during fabrication of isolation structures. Another example process is described with reference to FIGS. 16-20.

Figure 16:
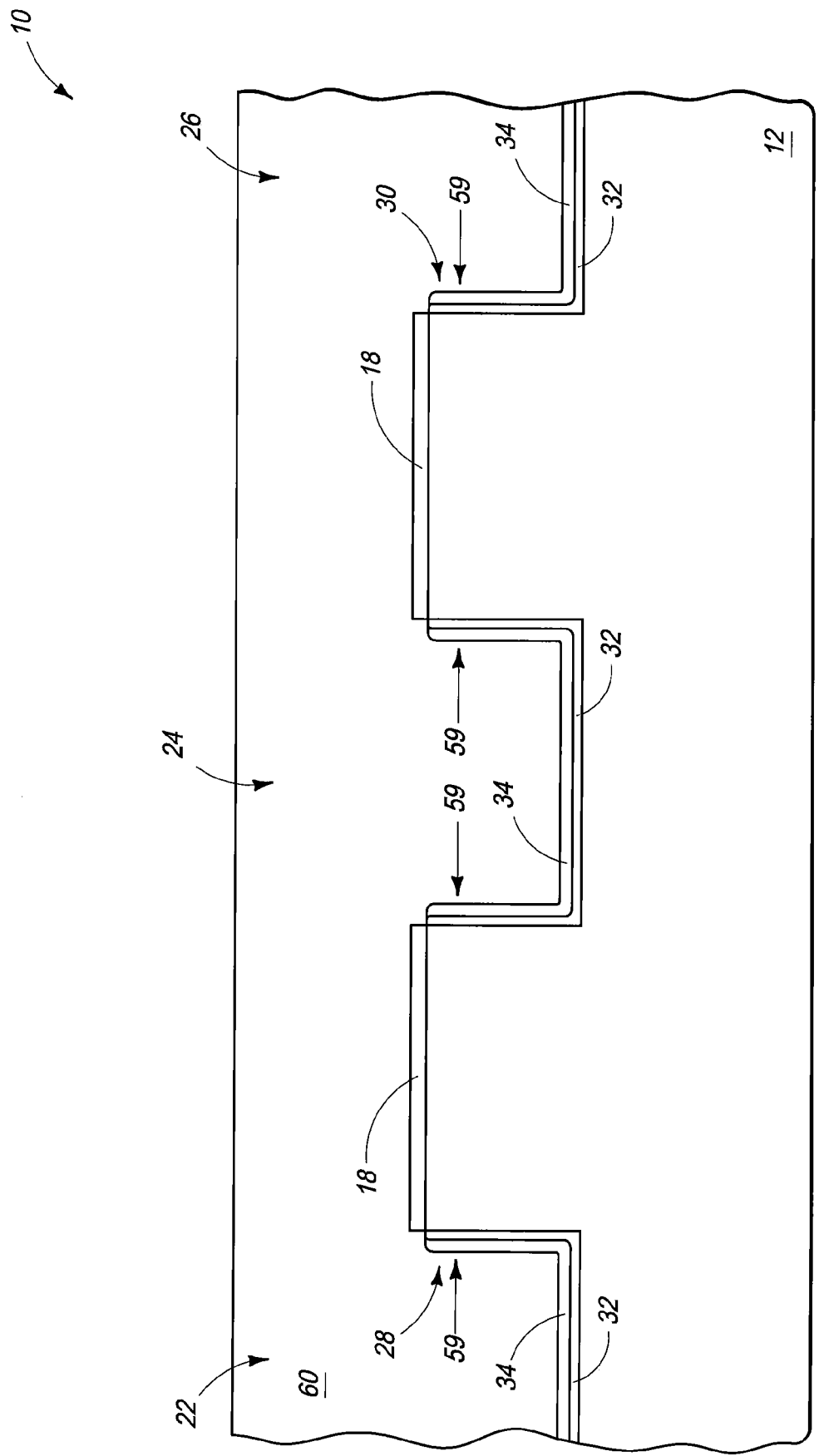
FIGS. 16-20 are diagrammatic cross-sectional views of a portion of a semiconductor construction at various process stages of another example embodiment method, with the processing stage of FIG. 16 following that of FIG. 11.

Referring to FIG. 16, construction 10 is shown at a processing stage subsequent to that of FIG. 11, and specifically after material 20 (FIG. 10) has been removed from over projections 28 and 30. The pad oxide material 18 is shown remaining over projections 28 and 30. In other embodiments (not shown), the pad oxide material may be removed and then replaced with another insulative material at a processing stage analogous to that of FIG. 16. In yet other embodiments (not shown), the pad oxide material may be removed to leave material 12 exposed at the upper surfaces of projections 28 and 30 at a processing stage analogous to that of FIG. 16.

Material 60 has been deposited (or flowed) over construction 10 and within openings 22, 24 and 26. The material 60 creates the stresses indicated by arrows 59. In some embodiments, the material 60 may be an SOD material (such as polysilazane) that is flowed into openings 22, 24 and 26, and then thermally treated (for instance, treated at a temperature of at least about 400° C., and preferably less than 1000° C.) to densify the material 60.

In the shown embodiment, the masking material 20 (FIG. 10) is removed from over projections 28 and 30 prior to flowing the material 60 into the openings 22, 24 and 26. In other embodiments, the masking material 20 may remain over projections 28 and 30 at the processing stage of FIG. 16.

Figure 17:
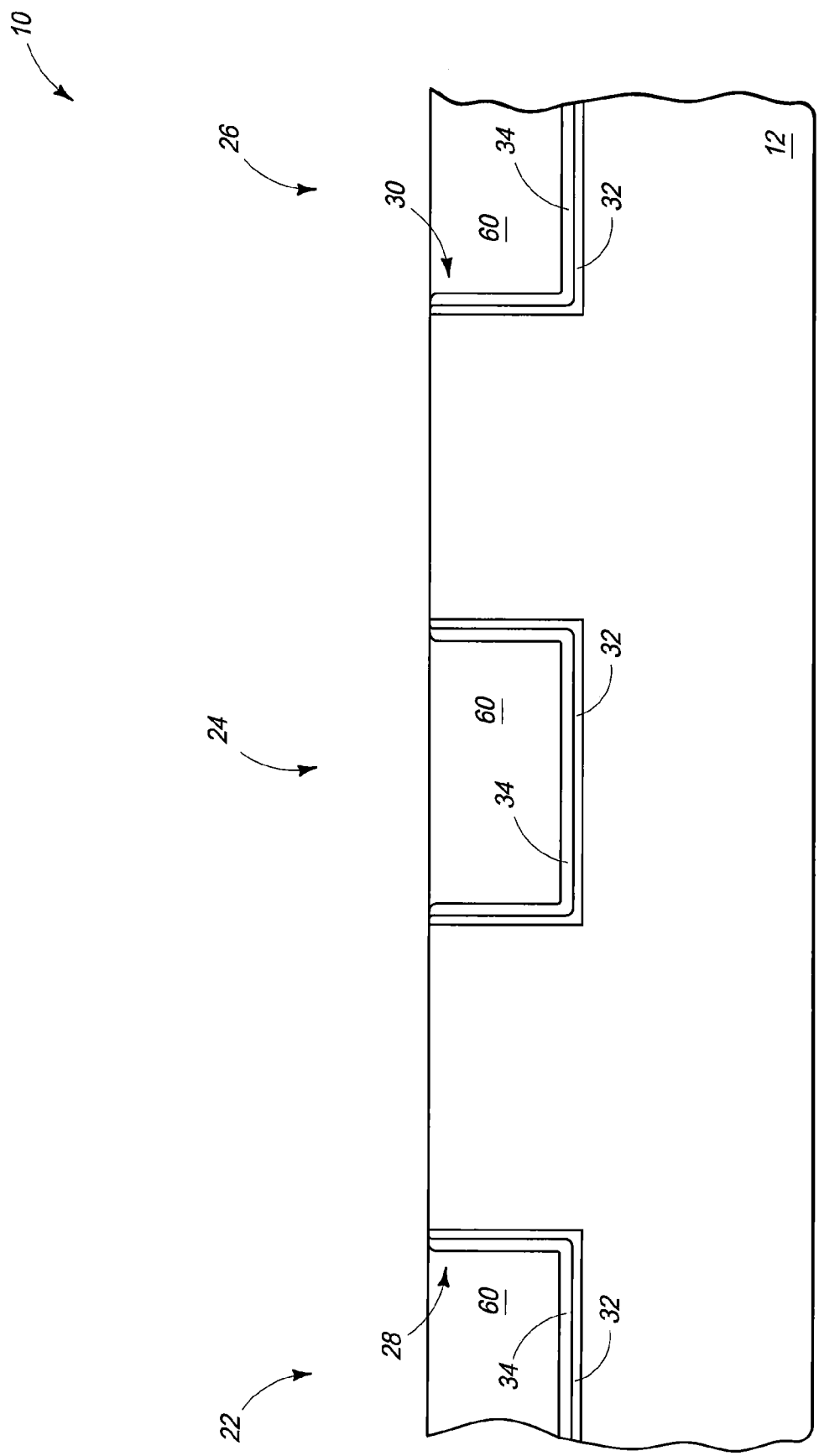

Referring to FIG. 17, planarization is conducted to remove material 60 from over projections 28 and 30, and to remove pad oxide 18 (FIG. 16).

Figure 18:
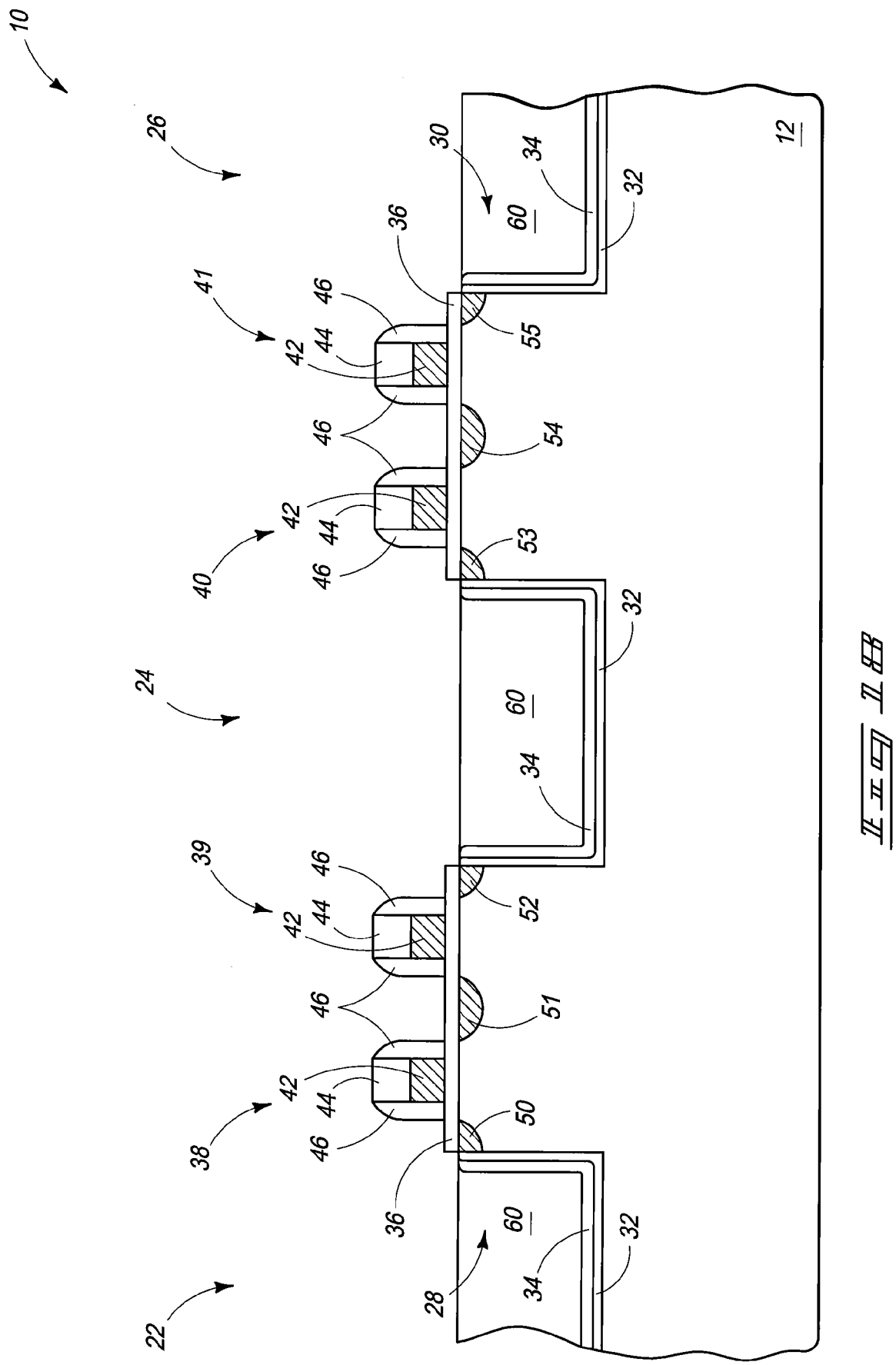

Referring to FIG. 18, gate dielectric 36 is formed over the active area projections, transistor gates 30-41 are formed, and the source/drain regions 50-55 are formed.

The illustrated transistors of FIG. 18 may be utilized for fabrication of DRAM unit cells as discussed above with reference to FIG. 6. In other embodiments, the transistors and source/drain regions may be configured for incorporation into other integrated circuitry, such as, for example, CMOS.

Figure 19:
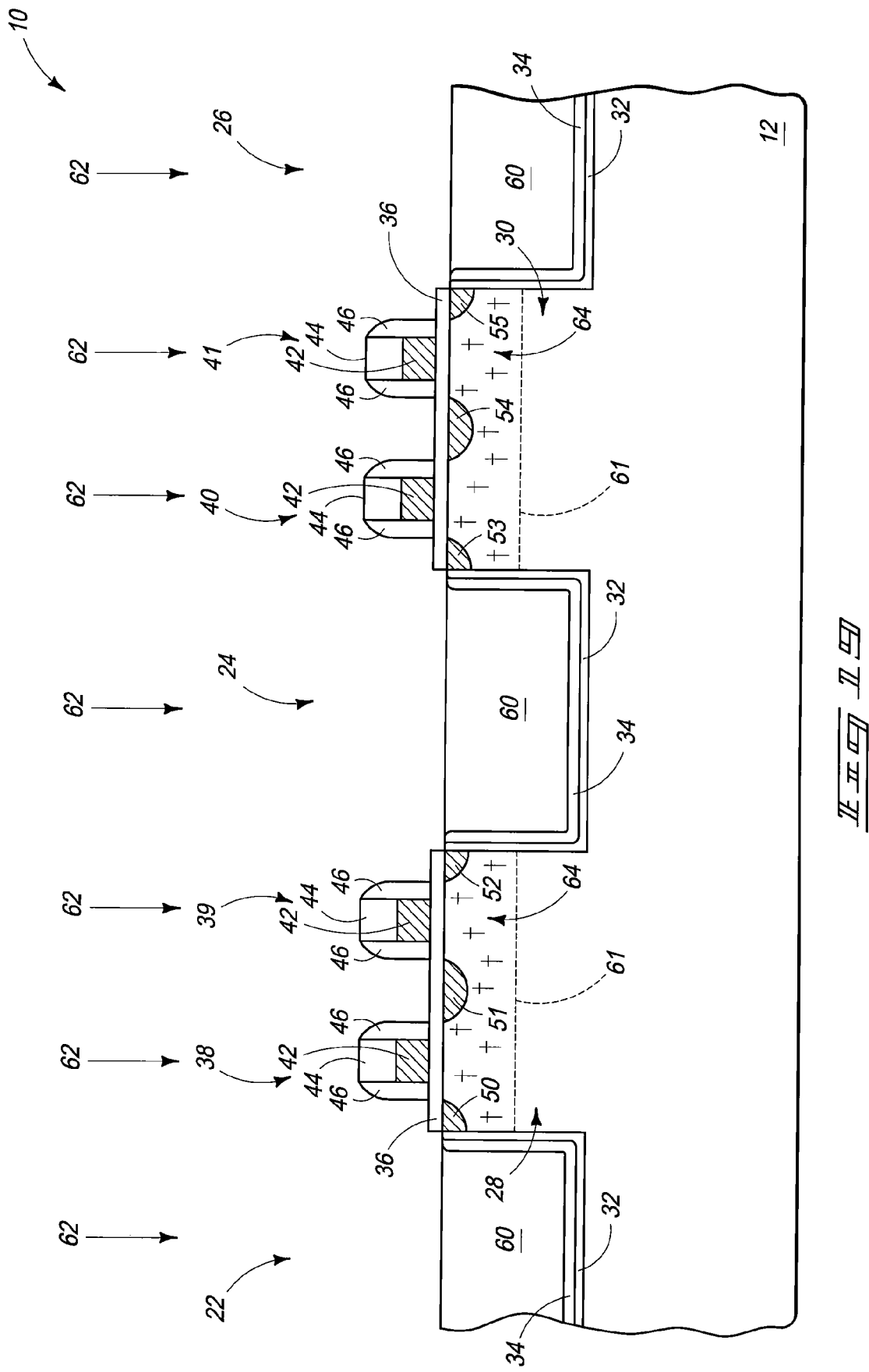

Referring to FIG. 19, dopant 62 is implanted into the monocrystalline semiconductor material 12 of projections 28 and 30 to amorphize such material, and to thereby create amorphized regions 64. Such amorphized regions may be at least 75 percent amorphous, and in some embodiments may be entirely amorphous. Although the implant of dopant 62 is shown occurring at a processing stage subsequent to the implant of the source/drain regions 50-55, in other embodiments the implant of species 62 may occur simultaneously with the implant of one or more of the source/drain regions. In yet other embodiments, the dopant 62 may be implanted prior to implanting at least some of the dopant of the source/drain regions 50-55; and may, for example, be implanted at the processing stage of FIG. 17. In some embodiments, the amorphized region 64 will not have the shown straight line lower boundary 61 due to shadowing effects of the gates 38-41 during the implant of species 62. In some embodiments, gate dielectric layer 36 is only present under material 42.

Figure 20:
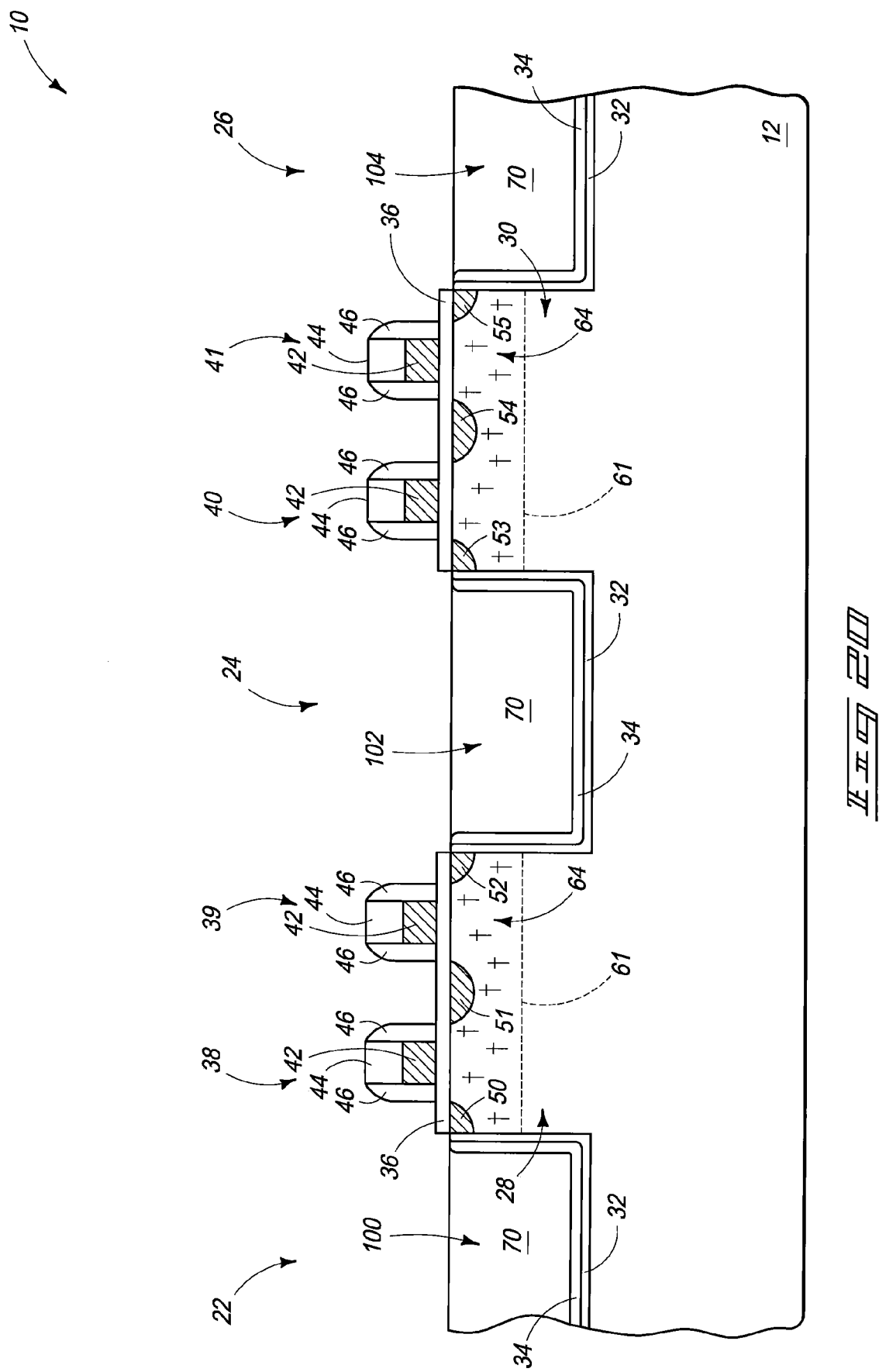

Referring to FIG. 20, material 60 (FIG. 19) is subjected to appropriate thermal processing to convert the material 60 into a dielectric material 70, and to thereby form isolation structures 100, 102 and 104 within openings 22, 24 and 26. The thermal processing of material 60 may utilize a temperature of at least about 400° C. (such as a temperature of from about 400° C. to about 1100° C.). In some embodiments, such thermal processing may simultaneously activate dopant in source/drain regions 50-55. In other embodiments, additional thermal processing may be utilized to activate the dopant in the source/drain regions. The amorphization of the semiconductor material within regions 64 may avoid propagation of defects that could otherwise occur during the activation of dopant within the source/drain regions.

Although many of the specific embodiments of FIGS. 1-20 pertain to methods of forming memory, the problems associated with SOD materials may occur in numerous other semiconductor fabrication applications. The methods described herein may be utilized to alleviate or prevent defect propagation in any application in which it would be advantageous to amorphize crystalline semiconductor material prior to a thermal anneal of an SOD material.

In the embodiments of FIGS. 1-20, the preliminary material 60 is a material, such as an SOD material, that is ultimately converted into a desired dielectric material. In other embodiments, a desired dielectric material may be directly deposited in place of preliminary material 60. In such other embodiments, the thermal treatment of a preliminary material may be avoided as a mechanism that would propagate dislocations and other defects through active regions. However, other thermal treatments may still be utilized (such as, for example, thermal treatments that activate dopant in source/drain regions), and such thermal treatments may propagate dislocations and other defects through active regions. Thus, it may still be desired to conduct the amorphization within projections 28 and 30 even in embodiments in which desired insulative material is directly deposited (i.e., even in embodiments in which SOD materials, or other preliminary materials, are not utilized).

The embodiments discussed above may be utilized in electronic systems, such as, for example, computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction comprising:
    a semiconductor material base which comprises a projection between a pair of openings; the projection having an upper region over a lower region; the upper region being at least 75% amorphous, and the lower region being entirely crystalline;
    one or more dielectric materials within said openings to fill the openings;
    at least one transistor gate over the upper region of the projection;
    at least two source/drain regions that extend into the upper region of the projection, and that do not extend into the lower region of the projection; the source/drain regions extending only partially into the upper region of the projection to leave some of the upper region between bottoms of the source/drain regions and a top of the lower region; and
    wherein the upper region corresponds to less than or equal to about one-third of a total length of the projection.

2. The construction of claim 1 wherein the semiconductor material base consists of monocrystalline silicon.

3. A semiconductor construction comprising:
    a semiconductor material base which comprises a projection between a pair of openings; the projection having an upper region over a lower region; the upper region being at least 75% amorphous, and the lower region being entirely crystalline;
    one or more dielectric materials within said openings to fill the openings;
    at least one transistor gate over the upper region of the projection;
    at least two source/drain regions that extend into the upper region of the projection, and that do not extend into the lower region of the projection; the source/drain regions extending only partially into the upper region of the projection to leave some of the upper region between bottoms of the source/drain regions and a top of the lower region; and
    wherein the upper region is entirely amorphous.

4. A semiconductor construction comprising:
    a semiconductor material base which comprises a projection between a pair of openings; the projection having an upper region over a lower region; the upper region being at least 75% amorphous, and the lower region being entirely crystalline;
    one or more dielectric materials within said openings to fill the openings;
    at least one transistor gate over the upper region of the projection;
    at least two source/drain regions that extend into the upper region of the projection, and that do not extend into the lower region of the projection; the source/drain regions extending only partially into the upper region of the projection to leave some of the upper region between bottoms of the source/drain regions and a top of the lower region; and
    comprising boron throughout an entirety of the upper region.

5. A semiconductor construction comprising:
    a semiconductor material base which comprises a projection between a pair of openings; the projection having an upper region over a lower region; the upper region being at least 75% amorphous, and the lower region being entirely crystalline;
    one or more dielectric materials within said openings to fill the openings;
    at least one transistor gate over the upper region of the projection;
    at least two source/drain regions that extend into the upper region of the projection, and that do not extend into the lower region of the projection; the source/drain regions extending only partially into the upper region of the projection to leave some of the upper region between bottoms of the source/drain regions and a top of the lower region; and
    comprising dopant having a mass greater than 35 amu throughout an entirety of the upper region.

6. A semiconductor construction comprising:
    a semiconductor material base which comprises a projection between a pair of openings; the projection having an upper region over a lower region; the upper region being at least 75% amorphous, and the lower region being entirely crystalline;
    one or more dielectric materials within said openings to fill the openings;
    at least one transistor gate over the upper region of the projection;
    at least two source/drain regions that extend into the upper region of the projection, and that do not extend into the lower region of the projection; the source/drain regions extending only partially into the upper region of the projection to leave some of the upper region between bottoms of the source/drain regions and a top of the lower region; and
    comprising dopant having a mass greater than 40 amu throughout an entirety of the upper region.

* * * * *